(12) United States Patent
Takahashi

(10) Patent No.: US 8,334,563 B2
(45) Date of Patent: Dec. 18, 2012

(54) FIELD-EFFECT SEMICONDUCTOR DEVICE AND METHOD OF PRODUCING THE SAME

(75) Inventor: Ryoji Takahashi, Niiza (JP)

(73) Assignee: Sanken Electric Co., Ltd., Niiza-shi (JP)

( * ) Notice: Subject to any disclaimer, the term of this patent is extended or adjusted under 35 U.S.C. 154(b) by 204 days.

(21) Appl. No.: 12/959,037

(22) Filed: Dec. 2, 2010

(65) Prior Publication Data

US 2011/0073938 A1   Mar. 31, 2011

Related U.S. Application Data

(63) Continuation-in-part of application No. PCT/JP2009/059864, filed on May 29, 2009.

(30) Foreign Application Priority Data

Jun. 2, 2008 (JP) ................................. 2008-145155

(51) Int. Cl.
*H01L 21/00* (2006.01)

(52) U.S. Cl. ......... 257/328; 257/334; 257/331; 438/270

(58) Field of Classification Search .................. 257/331, 257/334, 328; 438/270
See application file for complete search history.

(56) References Cited

U.S. PATENT DOCUMENTS

| | | | |
|---|---|---|---|
| 3,643,114 A * | 2/1972 | Christensen | 327/208 |
| 3,718,916 A * | 2/1973 | Wada et al. | 365/182 |
| 4,596,002 A * | 6/1986 | Chan et al. | 365/189.06 |
| 4,645,948 A * | 2/1987 | Morris et al. | 327/538 |
| 4,830,976 A * | 5/1989 | Morris et al. | 438/238 |
| 5,637,898 A * | 6/1997 | Baliga | 257/330 |
| 5,742,076 A * | 4/1998 | Sridevan et al. | 257/77 |
| 6,576,956 B2 * | 6/2003 | Kawanaka | 257/347 |

(Continued)

FOREIGN PATENT DOCUMENTS

EP   0 656 661 A1   6/1995

(Continued)

OTHER PUBLICATIONS

Extended European Search Report issued Jun. 24, 2011, in Patent Application No. 09758263.9.

*Primary Examiner* — Laura Menz

(74) *Attorney, Agent, or Firm* — Oblon, Spivak, McClelland, Maier & Neustadt, L.L.P.

(57) ABSTRACT

A semiconductor substrate of an IGFET has drain regions, a p-type first body region, a p⁻-type second body region, an n-type first source region, and an n⁺-type second source region, and additionally has multiple pairs of trenches that constitute an IGFET cell. A gate insulating film and a gate electrode are provided inside the trenches. A source electrode is in Schottky contact with the second body region. A pn junction between the second drain region and the first body region is exposed to one of the main surfaces of the semiconductor substrate. The first body region, the second body region, and the first source region are also provided outside the trenches, and an n-type protective semiconductor region is provided. The trenches contribute to miniaturization of the IGFET and to lowering of the on-resistance. The reverse breakdown voltage of the IGFET can be improved by the reduction in contact area between the second body region and the source electrode to the outside from the trenches.

13 Claims, 14 Drawing Sheets

U.S. PATENT DOCUMENTS

| | | | |
|---|---|---|---|
| 6,898,778 B2 * | 5/2005 | Kawanaka | 716/102 |
| 7,058,922 B2 * | 6/2006 | Kawanaka | 716/54 |
| 7,161,208 B2 * | 1/2007 | Spring et al. | 257/328 |
| 7,176,521 B2 * | 2/2007 | Kawamura et al. | 257/330 |
| 7,211,837 B2 * | 5/2007 | Tomomatsu et al. | 257/156 |
| 7,364,971 B2 * | 4/2008 | Yamaguchi et al. | 438/268 |
| 7,417,266 B1 * | 8/2008 | Li et al. | 257/135 |
| 7,541,642 B2 * | 6/2009 | Kawamura et al. | 257/331 |
| 7,675,111 B2 * | 3/2010 | Arai | 257/330 |
| 7,705,396 B2 * | 4/2010 | Adan | 257/329 |
| 7,709,931 B2 * | 5/2010 | Torii | 257/586 |
| 7,800,187 B2 * | 9/2010 | Matsuura | 257/409 |
| 7,863,678 B2 * | 1/2011 | Takahashi | 257/331 |
| 7,872,315 B2 * | 1/2011 | Takahashi | 257/393 |
| 8,022,474 B2 * | 9/2011 | Haeberlen et al. | 257/331 |
| 8,203,181 B2 * | 6/2012 | Hirler | 257/331 |
| 2002/0020878 A1 * | 2/2002 | Kawanaka | 257/351 |
| 2002/0047124 A1 | 4/2002 | Kitabatake | |
| 2003/0162356 A1 * | 8/2003 | Kawanaka | 438/275 |
| 2005/0185440 A1 * | 8/2005 | Kawanaka | 365/72 |
| 2006/0226439 A1 | 10/2006 | Robb et al. | |
| 2006/0289928 A1 * | 12/2006 | Takaya et al. | 257/330 |
| 2007/0018243 A1 * | 1/2007 | Ono et al. | 257/330 |
| 2008/0029812 A1 | 2/2008 | Bhalla | |
| 2008/0251810 A1 * | 10/2008 | Torii | 257/139 |
| 2009/0173995 A1 * | 7/2009 | Takahashi | 257/330 |
| 2009/0236660 A1 * | 9/2009 | Takahashi | 257/334 |
| 2010/0078707 A1 * | 4/2010 | Haeberlen et al. | 257/328 |
| 2010/0155830 A1 * | 6/2010 | Takahashi | 257/328 |
| 2010/0301410 A1 * | 12/2010 | Hirler | 257/334 |
| 2011/0073938 A1 * | 3/2011 | Takahashi | 257/328 |
| 2011/0136310 A1 * | 6/2011 | Grivna | 438/270 |
| 2011/0272761 A1 * | 11/2011 | Haeberlen et al. | 257/334 |
| 2012/0146024 A1 * | 6/2012 | Lysacek et al. | 257/52 |

FOREIGN PATENT DOCUMENTS

| | | |
|---|---|---|
| EP | 1 204 145 A2 | 5/2002 |
| EP | 1 204 145 A3 | 5/2002 |
| JP | 07-015009 | 1/1995 |
| JP | 09-045938 | 2/1997 |
| JP | 2002-203966 | 7/2002 |
| JP | 2003-017701 | 1/2003 |
| JP | 2004-221218 | 8/2004 |
| JP | 2009-065026 | 3/2009 |
| WO | WO 2009/031567 | 3/2009 |
| WO | WO 2009147996 A1 * | 12/2009 |

* cited by examiner

FIELD-EFFECT SEMICONDUCTOR DEVICE AND METHOD OF PRODUCING THE SAME

CROSS-REFERENCE TO RELATED APPLICATIONS

This is a continuation-in-part Application of PCT International Application No. PCT/JP2009/059864 (filed May 29, 2009), which in turn based upon and claims the benefit of priority from Japanese Patent Application No. 2008-145155 (filed Jun. 2, 2008), the entire contents of which are incorporated herein by reference.

BACKGROUND OF THE INVENTION

1. Field of the Invention

The present invention relates to a semiconductor device such as an insulated-gate field-effect transistor (IGFET) having a Schottky junction, which prevents conduction in response to an application of a reverse voltage, and to a method of production thereof.

2. Description of the Related Art

IGFETs with large current-carrying capacities find extensive use as electric circuit switches. A typical IGFET has a source electrode in ohmic contact not only with a source region but also with a body (or base) region. A source-drain current path is therefore formed, which passes through a parasitic diode (known also as a body diode or inbuilt diode) due to a p-n junction formed between the drain and body regions, in addition to the current path through a conducting channel set up in the body region. In an n-channel IGFET the parasitic diode is inversely biased when the drain electrode is higher in potential than the source electrode, so that there is then no current path through the parasitic diode. However, the electric circuit incorporating the IGFET may require the drain electrode to be less in potential than the source electrode. The parasitic diode will then be forward biased, permitting current flow therethrough. When used for switching an inverter (dc-to-ac converter) circuit, such an IGFET offers the benefit of providing a regenerative current path through the parasitic diode.

Some electric circuits, however, require elements to resist current flow through parasitic diodes. This demand has so far been met by connecting the IGFET in series with an external diode, which has an in inverse polarity to the parasitic diode. The external diode performs a reverse blocking function, preventing current flow through the IGFET when the drain electrode grows is placed in lower potential than the source electrode. An objection to use of the external diode is that when built on the identical substrate where the IGFET is formed, it necessarily requires a greater size of the substrate and increases the production cost. If fabricated on separate substrates, on the other hand, an electric circuit, in which both the IGFET and external diode are incorporated, as a whole will be more bulky and expensive. A further disadvantage is a power loss incurred as current common to that flowing the IGFET is made to flow through the external diode. As an additional drawback, the current through the IGFET is uncontrollable during application of a reverse voltage when the drain electrode is lower in potential than the source electrode.

Designed to defeat all these difficulties associated with the external diode is the planer IGFET described and claimed in Japanese Unexamined Patent Publication No. 7-15009, in which the source electrode makes Schottky contact with the body region. This prior art planer IGFET is illustrated in FIG. 1 of the drawings attached hereto, and its equivalent circuit in FIG. 2.

A planer IGFET of the prior art illustrated in FIG. 1 has a substrate 1 of semiconductor silicon material, a drain electrode 2, a source electrode 3, a gate electrode 4, and a gate insulator film 5. The semiconductor silicon substrate 1 is variously doped to include an $n^+$-type first drain region 6 with a high impurity concentration, an $n^-$-type second drain (or drift) region 7 with a low impurity concentration, a p-type first body (or base) region 8, a $p^-$-type second body (or base) region 9 with an impurity concentration less than that of the first body region 8, and an $n^+$-type source region 10 with a relatively high impurity concentration. The substrate 1 is formed to provide a pair of major surfaces $1a$ and $1b$ opposite to each other. The drain electrode 2 is formed on the second major surface $1b$ of the substrate 1 in ohmic (low resistance) contact with the first drain region 6. Formed on the first major surface $1a$ of the substrate 1, the source electrode 3 makes ohmic contact with the $n^+$-type source region 10 and Schottky contact with the $p^-$-type second body region 9. The gate electrode 4 is disposed opposite both p-type first body region 8 and $p^-$-type second body region 9 via the gate insulator film 5.

When a voltage is impressed on the source-drain electrodes so as to keep the drain electrode 2 higher in potential than the source electrode 3, and a voltage is impressed between the gate electrodes 3 and 4 so as to cause conduction through the IGFET, a conducting n-type channel 11, as indicated by dashed lines in FIG. 1, will be formed near the exposed surfaces of the first and the second body regions 8 and 9. Thus the drain current will then flow along the path through the drain electrode 2, first drain region 6, second drain region 7, channel 11, $n^+$-type source region 10, and source electrode 3.

As shown in FIG. 2 which is an equivalent circuit, the planer IGFET of FIG. 1 comprises first and second p-n junction diodes $D_1$ and $D_2$ and a Schottky barrier diode $D_3$ in addition to the FET switch $Q_1$. The first p-n junction diode $D_1$ is a parasitic (inbuilt) diode due to the p-n junction between the $n^-$-type second drain region 7 and the p-type first body region 8. The second p-n junction diode $D_2$ is another parasitic diode due to the p-n junction between the $p^-$-type second body region 9 and the $n^+$-type source region 10. The Schottky barrier diode $D_3$ is formed by the Schottky junction between the source electrode 3 and the $p^-$-type second body region 9. Connected in inverse parallel with the FET switch $Q_1$, the first p-n junction diode $D_1$ is so polarized as to be inversely biased when the drain electrode 2 is higher in potential than the source electrode 3. The second p-n junction diode $D_2$ is connected in inverse series with the first p-n junction diode D. In an IGFET of a typical conventional type having no such Schottky barrier diode, a part corresponding to the Schottky barrier diode is made into a short-circuit state. Consequently, in such a conventional IGFET, an equivalent to the second p-n junction diode $D_2$ serves no function whatsoever and thus will not be reflected in an equivalent circuit. The Schottky barrier diode $D_3$ is connected in inverse series with the first p-n junction diode $D_1$ and in parallel with the second p-n junction diode $D_2$.

As, in the IGFET of FIGS. 1 and 2, the first p-n junction diode $D_1$ is then inversely biased and the Schottky barrier diode $D_3$ forward biased when the drain electrode 2 is higher in potential than the source electrode 3, the IGFET is capable of operating in a way similar to the operates like an IGFET of a typical conventional type. On the other hand, as both second p-n junction diode $D_2$ and Schottky barrier diode $D_3$ are inversely biased when the drain electrode 2 is lower in potential than the source electrode 3, reverse current flow through any part in the IGFET except the channel 11 is blocked.

SUMMARY OF THE INVENTION

The present invention is intended to provide an IGFET with improvements in view of various issues including breakdown voltage.

According to a first aspect of the present invention, a field-effect semiconductor device is comprised of: a semiconductor substrate comprising first and second major surfaces extending parallel to each other, and at least a pair of trenches extending from the first major surface thereof toward but short of reaching the second major surface thereof; a drain region of a first conductivity type having a surface exposed at the second major surface, the drain region being disposed contiguous to the pair of trenches; a first body region of a second conductivity type comprising a cell subregion disposed between the pair of trenches and contiguous to the drain region, a first outer subregion disposed outside the pair of trenches and contiguous to the drain region and having a first mean impurity concentration, and a second outer subregion disposed outside the first outer subregion and contiguous to the drain region; a second body region of the second conductivity type comprising a Schottky-barrier-diode-forming cell subregion and a Schottky-barrier-diode-forming outer subregion, the Schottky-barrier-diode-forming cell subregion having a mean impurity concentration lower than the first mean impurity concentration, being disposed between the pair of trenches and contiguous to the first body region, and having a surface exposed at the first major surface, the Schottky-barrier-diode-forming outer subregion having a mean impurity concentration lower than the first mean impurity concentration, being disposed outside the pair of trenches and contiguous to the first body region, and having a surface exposed at the first major surface; a source region of the first conductivity type having a cell subregion and an outer subregion, the cell subregion being disposed between the pair of trenches and contiguous to both the Schottky-barrier-diode-forming cell subregion and the trenches and having a surface exposed at the first major surface, the outer subregion being disposed outside the pair of trenches and contiguous to both the pair of trenches and the Schottky-barrier-diode-forming outer subregion and having a surface exposed at the first major surface; a Schottky barrier diode protect semiconductor region disposed outside the Schottky-barrier-diode-forming outer subregion and contiguous to the Schottky-barrier-diode-forming outer subregion and having a surface exposed at the first major surface; a drain electrode disposed on the second major surface in ohmic contact with the drain region; a source electrode disposed on the first major surface in ohmic contact with both the source region and the Schottky barrier diode protect semiconductor region and in Schottky contact with both the Schottky-barrier-diode-forming cell subregion and Schottky-barrier-diode-forming outer subregion; a gate insulator formed in the pair of trenches; and a gate electrode disposed in the pair of trenches with interposing the gate insulator.

According to a second aspect of the present invention, a method of producing a field-effect semiconductor device is comprised of: providing a semiconductor substrate of a first conductivity type, the semiconductor substrate having first and second opposite major surfaces; forming a mask covering an outer part of the first major surface; carrying out selective diffusion of an impurity of a second conductivity type into the semiconductor substrate by using the mask, thereby forming a first body region and obtaining a drain region comprising a part in the semiconductor substrate not subject to the diffusion of the impurity of the second conductivity type; forming in the semiconductor substrate at least a pair of trenches extending from the first major surface toward the second major surface and having a depth to reach the drain region; forming a gate insulator film on sides surfaces of the trenches; forming in each trench a gate electrode which is opposed to at least the first body region with interposing the gate insulator film; either before or after the formation of the trenches, selectively diffusing an impurity of the second conductivity type into the semiconductor substrate from the first major surface in a concentration not sufficient to change conductivity type, thereby forming a second body region of the second conductivity type comprising a Schottky-barrier-diode-forming cell subregion and a Schottky-barrier-diode-forming outer subregion, the Schottky-barrier-diode-forming cell subregion having a mean impurity concentration lower than that of the first body region, being disposed between the pair of trenches and contiguous to the first body region and having a surface exposed at the first major surface midway between the pair of trenches, the Schottky-barrier-diode-forming outer subregion having a mean impurity concentration lower than the first body region, being disposed contiguous to the first body region outside the pair of trenches and having a surface exposed at the first major surface outside the pair of trenches; either before or after the formation of the trenches, selectively diffusing an impurity of the first conductivity type into the semiconductor substrate from the first major surface, thereby forming a source region comprising a cell subregion and an outer subregion, the cell subregion being disposed between the pair of trenches and contiguous to both the cell subregion of the second body region and the pair of trenches and having a surface exposed at the first major surface, the outer subregion being disposed outside the pair of trenches at the first major surface and contiguous to both the pair of trenches and the outer subregion of the second body region and having a surface exposed at the first major surface; either concurrently with or separately from the formation of the source region, selectively diffusing an impurity of the first conductivity type into the semiconductor substrate from the first major surface, thereby forming a Schottky barrier diode protect semiconductor region so disposed as to have contiguity to the outer subregion of the second body region in a position farther away from the trenches than the outer subregion of the source region, the Schottky barrier diode protect semiconductor region having a surface exposed at the first major surface; forming a drain electrode on the second major surface in ohmic contact with the drain region; and forming a source electrode on the first major surface in ohmic contact with both the source region and the Schottky barrier diode protect semiconductor region and in Schottky contact with the second body region.

DETAILED DESCRIPTION OF THE PREFERRED EMBODIMENT

Certain embodiments of the present invention will be described hereinafter with reference to the appended drawings.

First Embodiment

Figure 3:
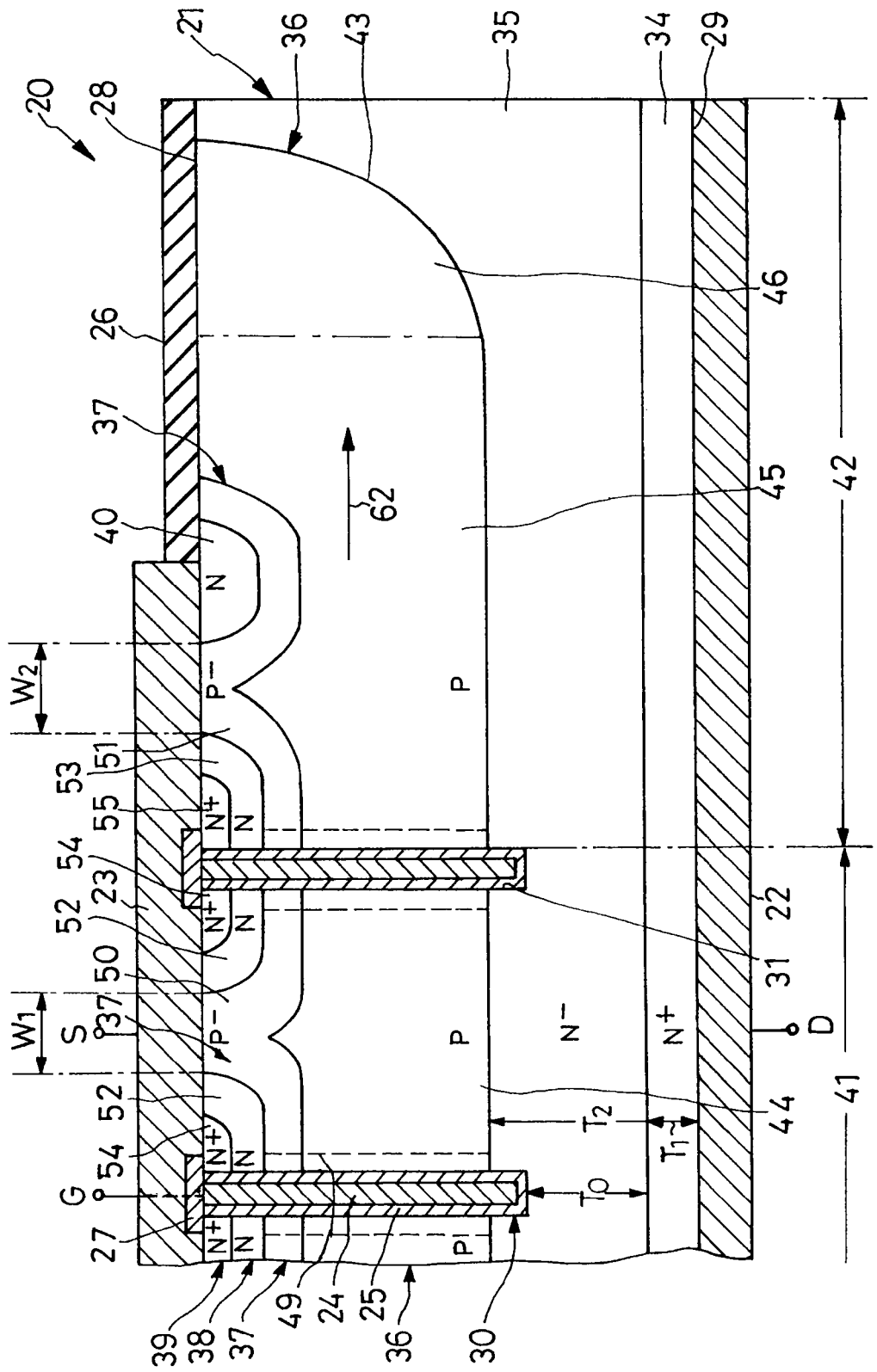
FIG. 3 is an explanatory partial sectional view of a preferred form of the IGFET according to a first embodiment of the present invention, the section being taken along the line A-A in FIG. 4.

A vertical insulated-gate field-effect transistor 20 including a Schottky barrier diode in accordance with a first embodiment of the present invention, namely vertical IGFET 20, as shown in FIG. 3, can be alternatively referred to as a trench structured IGFET. The IGFET 20 in general comprises a semiconductor substrate 21, a drain electrode 22, a source electrode 23, a gate electrode 24, a gate insulator films 25, a protective insulating film 26, and a separating insulating film 27.

Figure 4:
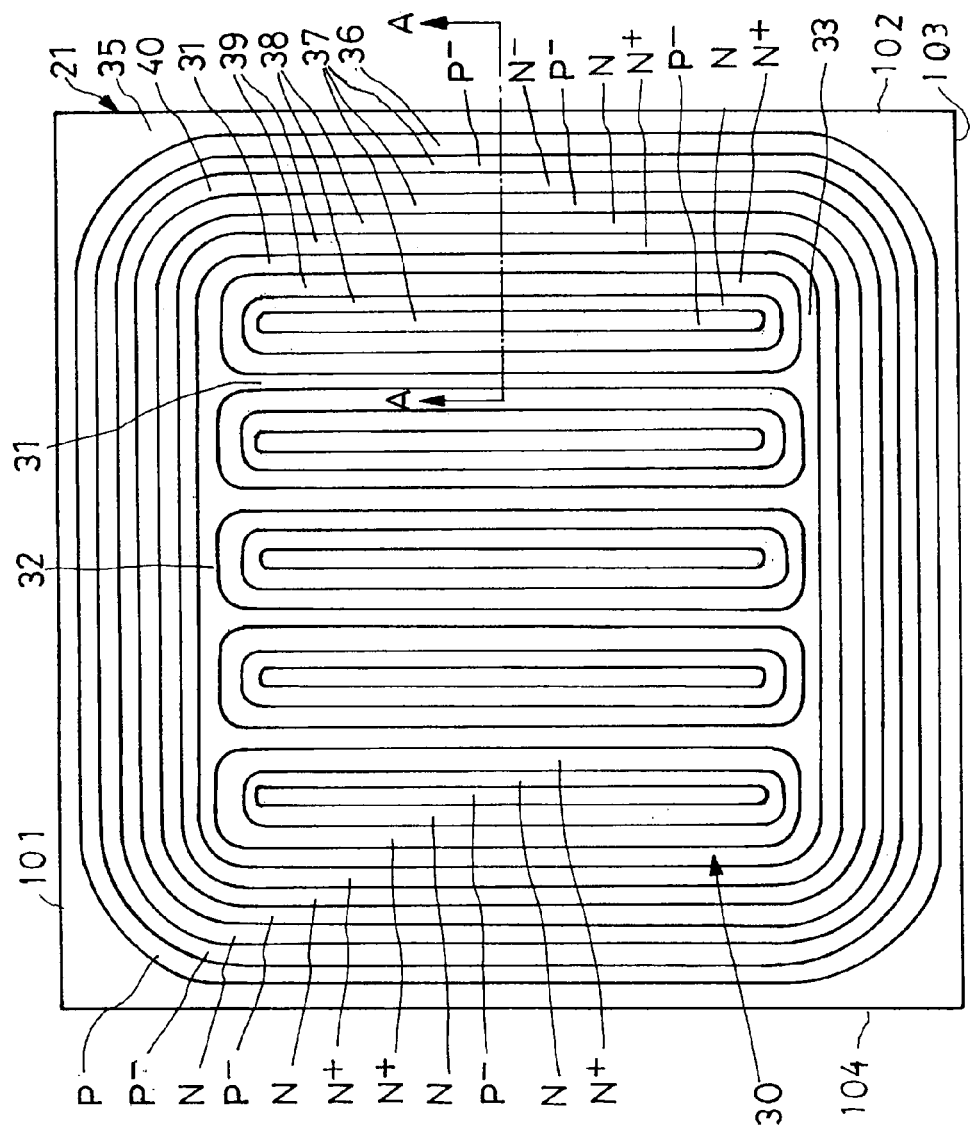
FIG. 4 is an explanatory plan view of the semiconductor substrate of the IGFET of FIG. 3, showing the first major surface of the substrate.

The semiconductor substrate 21, which can be alternatively referred to as a semiconductor substrate wafer, is made from silicon substrate wafer and has a first major surface 28 and a second major surface 29 opposite each other, and has trenches 30 approaching from the first major surface 28 toward the second major surface 29 to have a prescribed depth. As shown in FIG. 4, in a planar view, the semiconductor substrate 21 is formed into a rectangular shape having four sides 101, 102, 103 and 104. The trenches 30 of this embodiment are comprised of a plurality of cell trenches 31 for dividing the substrate 21 into as many cells, and connective trenches 32 and 33 for joining both ends of the cell trenches 31. As seen in a planar view, the cell trenches 31 extend parallel to each other and to the pair of opposite sides 102 and 104 of the substrate 21, as will be apparent from FIG. 4. The first connective trench 32 extends along the side 101 of the substrate 21 to join all the parallel cell trenches 31 each at one end thereof. The second connective trench 33 extends along the side 103 of the substrate 21 to join the other ends of all the cell trenches 31. Each neighboring pair of cell trenches 31 are used to provide one IGFET cell or unit, so that at least one pair of cell trenches are needed for an IGFET according to the present embodiment.

Not only the cell trenches 31 but also the connective trenches 32 and 33 accommodate parts of the gate electrode 24 via gate insulator films 25. The connective trenches 32 and 33 complete with the gate electrode 24 is effective to form depletion layers adjacent both ends of the cell trenches 31 extending at right angles therewith between the opposite pair of sides 101 and 103 of the substrate 21. However, the provision of these connective trenches 32 and are not of absolute necessity; instead, the cell trenches 31 might be made long enough to reach both of the pair of opposite substrate sides 101 and 103.

As another alternative to the connective trenches 32 and 33, all the cell trenches 31 might be wholly surrounded by one discrete trench of annular shape as seen in a plan view. In the trench arrangement of FIG. 4, such an annular trench might be thought of as being constituted of the two connective trenches 32 and 33 and the two outermost ones of the cell trenches 31.

The substrate 21 comprises an $n^+$-type first drain region 34 of high impurity concentration, an $n^-$-type second drain region 35 with an impurity concentration less than that of the first drain region 34, a p-type first body (or base) region 36, a $p^-$-type second body region 37 with an impurity concentration less than that of the first body region 36, a n-type first source region 38 of relatively low impurity concentration, an $n^+$-type second source region 39 with an impurity concentration higher than that of the first source region 38, and a Schottky barrier diode protect semiconductor region 40 disposed outside the trenches 30 with an n-type impurity concentration approximately equal to that of the first source region 38. For convenience of explanation the substrate 21 is shown divided by the dot-and-dash line in FIG. 3 into a central section 41 containing the cell trenches 31 and a peripheral section 42 outside the central section 41. The following is a more detailed description of the constituent regions and subregions of the substrate 21.

The $n^+$-type (first conductivity type) first drain region 34 is exposed at the second major surface of the substrate 21, is relatively high in impurity concentration (e.g., $1 \times 10^{19}$ cm$^{-3}$-$1 \times 10^{20}$ cm$^{-3}$), and has a thickness $T_1$ less than the distance between the second major surface of the substrate 21 and the bottoms of the trenches 30. The thickness of the first drain region 34 is the same in both central section 41 and peripheral section 42 of the substrate 21.

The $n^-$-type second drain region 35, sometimes called the drift region, is disposed adjacent the first drain region 34 and, for a higher blocking voltage of the IGFET 20, is made less in impurity concentration (e.g., $1 \times 10^{15}$ cm$^{-3}$-$1 \times 10^{17}$ cm$^{-3}$) than the first drain region 34. In the central section 41 of the substrate 21 the second drain region 35 has a thickness $T_2$ that is not less than the distance $T_0$ between the bottom of the cell trenches 31 and the first drain region 34. The second drain region 35 is not exposed at the first major face 28 of the substrate 21 in its central section 41 but is so exposed annularly around the first body region 36 in the peripheral section 42 of the substrate. The second drain region 35 being thus not exposed in the central section 41 of the substrate 21, the cell trenches 31 can be arranged with minimal spacings from one another, making possible a substantive size reduction of the IGFET 20. The second drain region 35 of low impurity concentration functions like a known high resistance collector region of a bipolar transistor.

The cell trenches 31 each extend from the first 28 toward the second 29 major surface of the substrate 21 and terminate in the second drain region 35, although alternatively they could terminate at the boundary between second drain region 35 and first body region 36. In any event the cell trenches 31 should be deep enough to reach the second drain region 35 but not the underlying first drain region 34. In the absence of the first drain region 34, and if the second drain region 35 is in direct contact with the drain electrode 22 as a consequence, then the cell trenches 31 may reach the second drain region 35, however, the cell trenches 31 of the present embodiment are formed to fall short of reaching the drain electrode 22.

In the meantime, all the cell trenches 31 are approximately at right angles with the pair of opposite major surfaces 28 and 29 of the substrate 21. One IGFET cell (micro IGFET) is formed between each neighboring pair of cell trenches 31. Although only one pair of cell trenches 31 appear in FIG. 3, it is understood that actually the substrate 21 has several pairs of cell trenches formed therein as in FIG. 4, so that as many IGFET cells are formed in this substrate.

The p-type first body region 36 lies next to the n⁻-type second drain region 35 and is contiguous to all the trenches 30 (namely, cell trenches 31 and connective trenches 32 and 33 as a whole). More specifically, in this particular embodiment, the first body region 36 is formed by selectively diffusing a p-type impurity into the preformed second drain region 35 from the first major surface 28 of the substrate 21 and thus takes the form of an island in the second drain region. Thus a p-n junction 43 formed between the second drain region 35 and the first body region 36 has a planar portion extending parallel to the substrate first major surface 28 and a curved portion extending between this planar portion and the substrate first major surface 28.

The first body region 36 comprises a cell subregion 44, a first outer subregion 45 and a second outer subregion 46. The cell subregion 44 of the first body region 36 lies between the pair of cell trenches 31 and forms part of the noted flat portion of the p-n junction 43 between itself and the second drain region 35. Disposed outside the pair of cell trenches 31, the first outer subregion 45 of the first body region 36 forms the rest of the flat portion of the p-n junction 43. The second outer subregion 46 of the first body region 36 lies farther away from the cell trenches 31 than does the first outer subregion 45 of the first body region and forms the noted curved portion of the p-n junction 43. The second outer subregion 46 of the first body region 36 is less in mean impurity concentration than the first outer subregion 45 thereof. FIG. 3 shows the first and the second outer subregions 45 and 46 of the first body region 36 marked off each other by the alternating dot-and-dash line.

Figure 7:
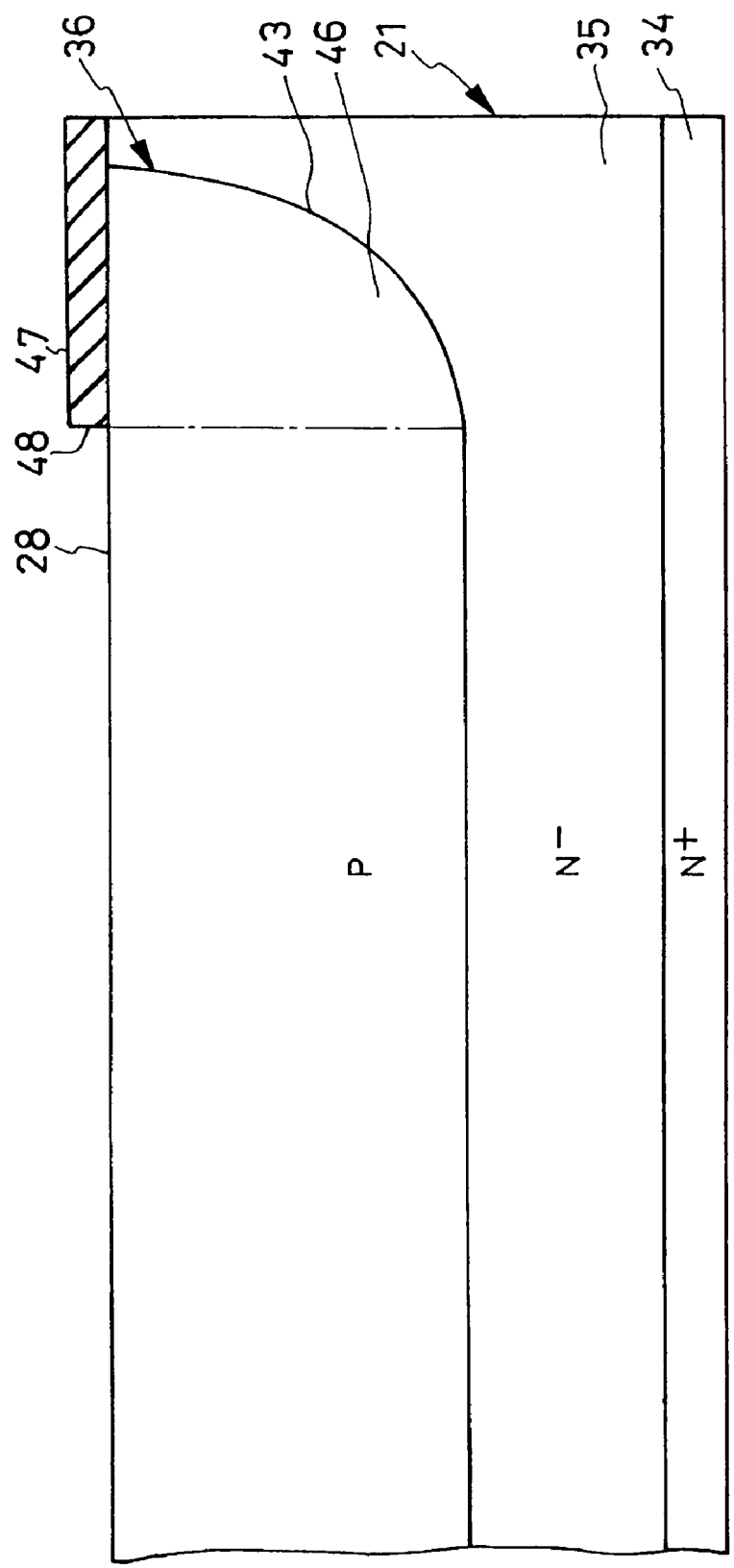
FIG. 7 is a view similar to FIG. 6 but showing the substrate after the subsequent formation of a p-type first body region therein.

The first body region 36 of a p-type is, as shown in FIG. 7, formed by thermally diffusing a p-type impurity such as boron into the substrate 21 through an opening 48 in a mask 47 on the first major surface 28 of the substrate. So formed, the p-type impurity concentration in the first body region 36 gradually decreases from the first substrate surface 28 toward the p-n junction 43 between itself and the n⁻-type second drain region 35. It will also be apparent that the second outer subregion 46, as shown in FIG. 3, of the first body region 36, which was covered by the mask 47 during the formation of the first body region by diffusion, is less in mean p-type impurity concentration than the cell subregion 44 and first outer subregion 45 of the first body region 36. Typically, both cell subregion 44 and first outer subregion 45 of the first body region 36 have a mean p-type impurity concentration ranging from $2 \times 10^{16}$ cm⁻³ to $2 \times 10^{17}$ cm⁻³, whereas that of the second outer subregion 46 of the first body region 36 is a little less, being from $1 \times 10^{16}$ cm⁻³ to $1 \times 10^{17}$ cm⁻³. The mean impurity concentration of the cell subregion 44 and first outer subregion 45 of the first body region 36 is so determined that an application of an above-threshold gate control voltage between gate conductors 24 and source electrode 23 results in the generation of the required n-channels, indicated by the dashed lines labeled 49 in FIG. 3, in and through the first body region 36.

Figure 5:
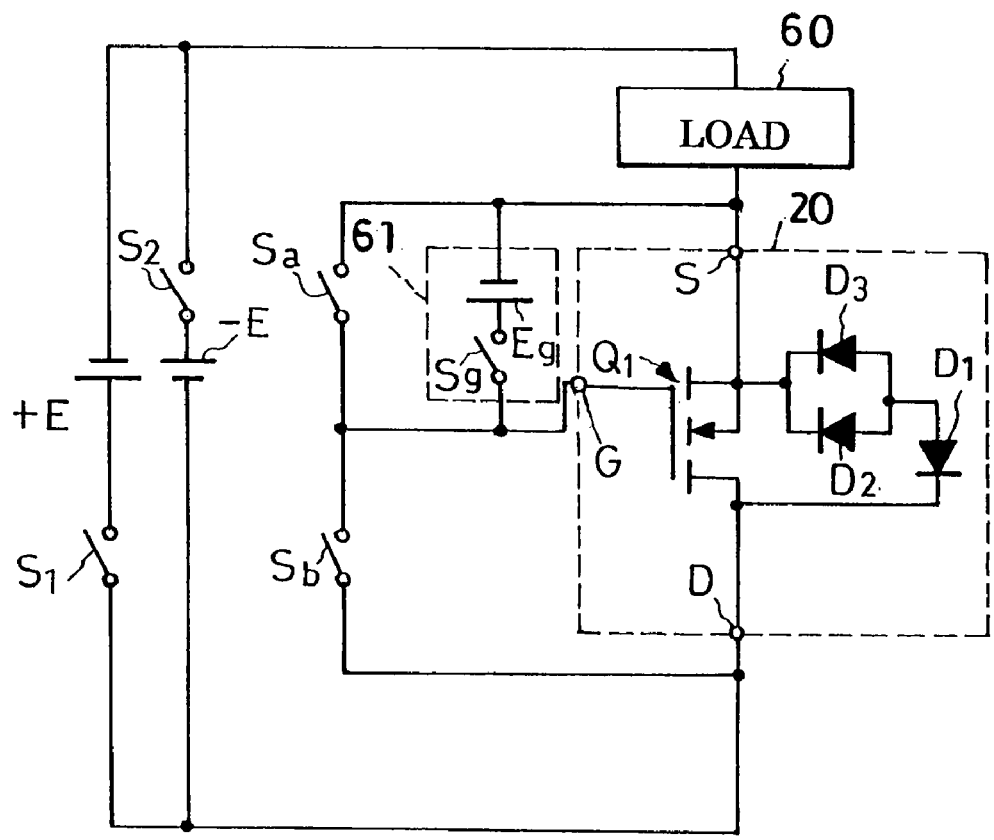
FIG. 5 shows the equivalent circuit of the IGFET of FIG. 3 together with a driver circuit therefor.

By the p-n junction 43 between second drain region 35 and first body region 36, a p-n junction diode $D_1$ as shown in FIG. 5 is established. The depth of the p-n junction 43 at the cell subregion 44 and first outer subregion 45 of the first body region 36, as measured from the first major surface 28 of the substrate 21, is greater than the thickness $T_2$ of the second drain region 35 at the central section 41 of the substrate 21. That distance of the p-n junction 43 at the second outer subregion 46 of the first body region 36 gradually diminishes as it extends outwardly of the substrate 21.

The p⁻-type second body region 37, which might also be referred to as a second base or Schottky-barrier-diode-forming region, is disposed contiguous to the first body region 36. The p-type impurity concentration of this second body region 37 is less than that of the cell subregion 44 and first outer subregion 45 of the first body region 36. The second body region 37 comprises a Schottky-barrier-diode-forming cell subregion 50 and a Schottky-barrier-diode-forming outer subregion 51. The Schottky-barrier-diode-forming cell subregion 50 of the second body region 37 has a surface exposed at the first major surface 28 of the substrate 21 centrally between the pair of cell trenches 31. The Schottky-barrier-diode-forming outer subregion 51 of the second body region 37 has a surface exposed at the first major surface of the substrate 21 outside the pair of cell trenches 31. Unlike the showing of FIG. 3 the Schottky-barrier-diode-forming cell subregion 50 and outer subregion 51 of the second body region 37 may not necessarily be contiguous to the cell trenches 31. The second body region 37 is in Schottky junction with the source electrode 23, providing a Schottky barrier diode with a reverse blocking voltage (a blocking voltage when a reverse source-drain voltage is applied, where the source is higher in potential than the drain) of 10 volts or more. In order to obtain a Schottky barrier diode having such a high reverse blocking voltage, the second body region 37 should have a surface impurity concentration (e.g., from $1 \times 10^{15}$ cm⁻³ to $2 \times 10^{16}$ cm⁻³) that is less than that of the cell subregion 44 and first outer subregion 45 of the first body region 36. The Schottky barrier diode now under consideration appears at $D_3$ in FIG. 5, the equivalent circuit of the IGFET. A Schottky barrier diode is produced by the Schottky junction between the source electrode 23 and the Schottky-barrier-diode-forming cell subregion 50 of the second body region 37, and another Schottky barrier diode is formed by the Schottky junction between the source electrode 23 and the Schottky-barrier-diode-forming outer subregion 51 of the second body region 37 as well. These Schottky-barrier diodes are in parallel connection with each other, so that they are represented in combination by one diode symbol and designated $D_3$ in FIG. 5. When the IGFET 20 is turned on, the channels 49 are generated which extend along the cell trenches 31 across the p⁻-type second body region 37.

In the IGFET 20 as depicted in FIG. 3, the source electrode 23 makes Schottky contact with the Schottky-barrier-diode-forming cell subregion 50 of the second body region 37 over an area having a width $W_1$, and with the Schottky-barrier-diode-forming outer subregion 51 of the second body region 37 over an area with a width $W_2$. The present inventor has discovered that the width $W_2$ or area of the Schottky contact between the source electrode 23 and the Schottky-barrier-diode-forming outer subregion 51 of the second body region 37 is deeply correlated with the blocking voltage of the IGFET 20. More will be said presently about this relationship between the width $W_2$ or area of the Schottky contact and the reverse blocking voltage of the IGFET.

The n-type first source region 38 is contiguous to both cell trenches 31 and p⁻-type second body region 37 and has a surface exposed at the first major surface 28 of the substrate 21. The first source region 38 is formed island-like in the second body region 37. More specifically, the first source region 38 comprises a pair of cell subregions 52 and an outer subregion 53. The pair of cell subregions 52 of the first source region 38 are both interposed between the pair of cell trenches 31 and themselves separated from each other by the Schottky-barrier-diode-forming cell subregion 50 of the second body region 37. The outer subregion 53 of the first source region 38 is disposed outside the outmost one of all of the cell trenches 31 in the substrate 21. The pair of cell subregions 52 of the first source region 38 are contiguous to both cell trenches 31 and Schottky-barrier-diode-forming cell subregion 50 of the second body region 37 and have surfaces exposed at the first major surface 28 of the substrate 21. The outer subregion 53 of the first source region 38 is contiguous to both of the Schottky-barrier-diode-forming outer subregion 51 of the second body region 37 and the outmost one of the cell trenches 31 and has a surface exposed at the first major surface 28 of the substrate 21. The outer subregion 53 of the first source region 38 serves also as a guard ring for protecting the Schottky barrier diode just like the Schottky barrier diode protect semiconductor region 40.

The p-n junction between the p⁻-type second body region 37 and the n-type first source region 38 provides a second p-n junction diode $D_2$ shown in FIG. 5. This diode $D_2$ is formed to have a reverse blocking voltage equal to or greater than that of the Schottky-barrier diode $D_3$. The n-type impurity concentration of the first source region 38 is therefore so determined (e.g., $1 \times 10^{16}$ cm⁻³ to $1 \times 10^{18}$ cm⁻³) as to impart a required reverse blocking voltage to the second p-n junction diode $D_2$.

The n⁺-type second source region 39 is contiguous to both the cell trenches 31 and the first source region 38 and has a surface exposed at the first major surface 28 of the substrate 21, being formed island-like in the first source region 38. More specifically, the second source region 39 has a pair of cell subregions 54 and an outer subregion 55. The pair of cell subregions 54 of the second source region 39 are both interposed between the pair of cell trenches 31 and themselves separated from each other by the first source region 38 and the Schottky-barrier-diode-forming cell subregion 50 of the second body region 37. The outer subregion 55 of the second source region 39 is disposed outside the cell trenches 31 in the substrate 21. The pair of cell subregions 54 of the second source region are contiguous to both cell trenches 31 and cell subregions 52 of the first source region 38 and have surfaces exposed at the first major surface 28 of the substrate 21. The outer subregion 55 of the second source region 39 is contiguous to both of the outer subregion 53 of the first source region 38 and the outmost one of the cell trenches in the substrate 21 and has a surface exposed at the first major surface of the substrate 21. Being intended for good electrical contact with the source electrode 23, the second source region 39 has an n-type impurity concentration (e.g., $1 \times 10^{18}$ cm⁻³ to $1 \times 10^{20}$ cm⁻³) that is higher than that of the first source region 38.

The n-type Schottky barrier diode protect semiconductor region 40, which can be referred to as a guard ring, is formed island-like in the Schottky-barrier-diode-forming outer subregion 51 of the second body region 37 on the outside of the Schottky contact surface (width $W_2$) of the Schottky-barrier-diode-forming outer subregion 51 of the second body region 37. The N-type Schottky barrier diode protect semiconductor region 40 is contiguous to the Schottky-barrier-diode-forming outer subregion 51 of the second body region 37 and has a surface exposed at the first major surface 28 of the substrate 21. The source electrode 23 partly overlies the thus-exposed surface of the Schottky barrier diode protect semiconductor region 40. One end of the p-n junction between the Schottky barrier diode protect semiconductor region 40 and the Schottky-barrier-diode-forming outer subregion 51 of the second body region 37 is exposed at the first major surface 28 of the substrate 21. The Schottky barrier diode protect semiconductor region 40 is formed concurrently with, and also has the identical n-type impurity concentration to the n-type first source region 38. This Schottky barrier diode protect semiconductor region 40 serves to enhance the blocking voltage of the Schottky barrier diode constituted of the source electrode 23 and the Schottky-barrier-diode-forming outer subregion 51 of the second body region 37, and has a function of guarding the Schottky-barrier-diode to improve its blocking voltage. In the embodiment of FIG. 3, while an equivalent to the n⁺-type second source region 39 is not formed in the n-type Schottky barrier diode protect semiconductor region 40, this may be formed to the contrary.

The source electrode 23 is formed on the first major surface 28 of the substrate 21 in ohmic contact with the first and second source electrodes 38 and 39 and Schottky barrier diode protect semiconductor region 40 and in Schottky contact with the second body region 37. Usually in the form of a stack of a titanium layer and an aluminum, or aluminum silicide, layer, the source electrode 23 is electrically connected to a source terminal S shown as a schematic symbol.

Made from metal such as aluminum, the drain electrode 22 is, on the second major surface 29 of the substrate 21, in ohmic contact with the first drain region 34, and is further connected to a drain terminal D schematically shown in the drawing.

The gate insulator films 25 are composed of layers of silicon oxide on the substrate surfaces defining the cell trenches 31. The gate electrodes 24 are composed of doped polycrystalline silicon, which fill the inside of the trenches 31. The doped polycrystalline silicon could, as it possesses electric conductivity, function as electrodes 24 like as metal. The gate electrodes 24 are electrically separated from the overlying gate electrode 23 by the insulating films 27 and electrically connected, via part of the first major surface 28 of the substrate 21 left uncovered by the source electrode 23, to a gate terminal G.

The protective insulating film 26 is provided on the part of the substrate surface 28 which is left uncovered by the source electrode 23. The film 26 serves to protect the p-n junction between a first drain region 35 and a first body region 36, and the p-n junction between second body region 37 and Schottky barrier diode protect semiconductor region 40. The protective insulating film 26 and separating insulating films 27 may be made of an identical material.

An electric circuit comprised of the IGFET 20 and its driver circuit is shown in FIG. 5 in view of its principle. An equivalent circuit to the IGFET of FIG. 3, shown in FIG. 5, is identical to the IGFET accompanying the Schottky barrier diode of the prior art, and comprises an FET switch $Q_1$, first and second p-n junction diodes (parasitic diodes) $D_1$ and $D_2$, and a Schottky barrier diode (parasitic diode) $D_3$. The first p-n junction diode $D_1$, equivalent to the p-n junction 43 in FIG. 3, is connected inversely between drain terminal D and source terminal S. Both second p-n junction diode $D_2$, equivalent to the p-n junctions between the second body region 37 and the first source region 38 and the Schottky barrier diode protect semiconductor region 40, and the Schottky barrier diode $D_3$, equivalent to the combination of the Schottky junction between the source electrode 23 and the Schottky-barrier-diode-forming cell subregion 50 of the second body region 37 and the Schottky junction between the source electrode 23 and the Schottky-barrier-diode-forming outer subregion 51 of the second body region 37, are connected between the drain terminal D and the source terminal S via the first p-n junction diode $D_1$ to have a forward polarity. In the meantime, the term "forward polarity" used above refers to a diode polarity such that the diode is forward biased when the drain terminal D is higher in potential than the source terminal S. On the other hand, the term "reverse polarity" refers to a diode polarity such that the diode is inversely biased when the drain terminal D is higher in potential than the source terminal S.

Two dc power supplies +E and −E are provided for driving the IGFET 20. The first dc power supply +E has its positive terminal connected to the drain terminal D via a first switch $S_1$, and its negative terminal to the source terminal S via a load 60. The second dc power supply −E has its positive terminal connected to the source terminal S via a second switch $S_2$ and the load 60. Therefore, a forward voltage is impressed to the IGFET 20 (drain potential higher than source potential) when the first switch $S_1$ is closed, and a reverse voltage to the IGFET (source potential higher than drain potential) when the second switch $S_2$ is closed. The dc power supplies +E and −E and switches $S_1$ and $S_2$ are replaceable by ac power supplies or bidirectional voltage generator circuits.

Connected between source terminal S and gate terminal G is a gating circuit or gate control circuit 61, which comprises a gating supply $E_g$ and a gating switch $S_g$. While the gating switching $S_g$ is, for instance, comprised of a transistor, when this is switched ON, a voltage from the gating power supply $E_g$ is applied to the gate terminal G. The drain current of the IGFET 20 changes in magnitude with the voltage amplitude of the gating power supply $E_g$.

The driver circuit for the IGFET shown in FIG. 5 additionally comprises two auxiliary switches $S_a$ and $S_b$ for bidirectional on-off operation (ac switching) and bidirectional current control of the IGFET 20. The first auxiliary switch $S_a$ is connected between source terminal S and gate terminal G, and the second auxiliary switch $S_b$ between gate terminal G and drain terminal D. Although shown as mechanical switches for illustrative convenience, the auxiliary switches $S_a$ and $S_b$ may preferably take the form of transistors or other controllable solid-state switches.

The first auxiliary switch $S_a$ is turned on when the first switch $S_1$ is on to make the drain terminal D higher in potential than the source terminal S and at the same time when the gating switch $S_g$ is off. Upon conduction of the first auxiliary switch a shorting path is provided between source terminal S and gate terminal G. As the gate terminal G thus gains the same potential as the source terminal S, the conducting channels 49 will thoroughly disappear from their positions indicated by the broken lines in FIG. 3, resulting in complete interruption of the drain current. Therefore, the blocking voltage of the IGFET 20 during application of a positive drain-source voltage is substantially equal to that of the first p-n junction diode $D_1$.

Let it be assumed that the second switch $S_2$ is now on, so that the source terminal S of the IGFET 20 is higher than its drain terminal D, and that the gating switch $S_g$ is off. If then the second auxiliary switch $S_b$ is turned on, it will provide a shorting path between drain terminal D and gate terminal G. The IGFET 20 will thus stay off, and no drain current will flow. Both second p-n junction diode $D_2$ and Schottky barrier diode $D_3$ are inversely biased while a reverse voltage is being impressed to the IGFET 20 as above. Consequently, the blocking voltage of the IGFET 20 during application of a reverse voltage depends upon that of the second p-n junction diode $D_2$ and Schottky barrier diode $D_3$.

When the two auxiliary switches $S_a$ and $S_b$ are both off, the drain current is controllable by the gating circuit 61 irrespective of whether the drain terminal D is higher or lower in potential than the source terminal S. More specifically, the channels 49 are formed across the first and the second body regions 37 and 38 upon application of an above-threshold voltage between gate terminal G and source terminal S from the gating power supply $E_g$. Conduction thus occurs between drain terminal D and source terminal S. The magnitude of the drain current is controllable through adjustment of the voltage amplitude of the gating power supply $E_g$.

The provision of the gating switch $S_g$ in the gating circuit 61 is not a necessity. The gating switch $S_g$ is indeed eliminable, and the gating power supply (or equivalent gating signal source) $E_g$ permanently connectable between source terminal S and gate terminal G.

As being apparent from the above description, the IGFET 20 is applicable as a bidirectional switch.

A production method for the IGFET shown in FIG. 3 will be described hereinafter with reference to FIGS. 6-9. In all these figures, for ease of explanation, the various regions of the semiconductor substrate will be designated by the same reference numerals throughout the process of fabrication despite alterations in regional and subregional geometry that occur in the course of manufacture.

Figure 6:
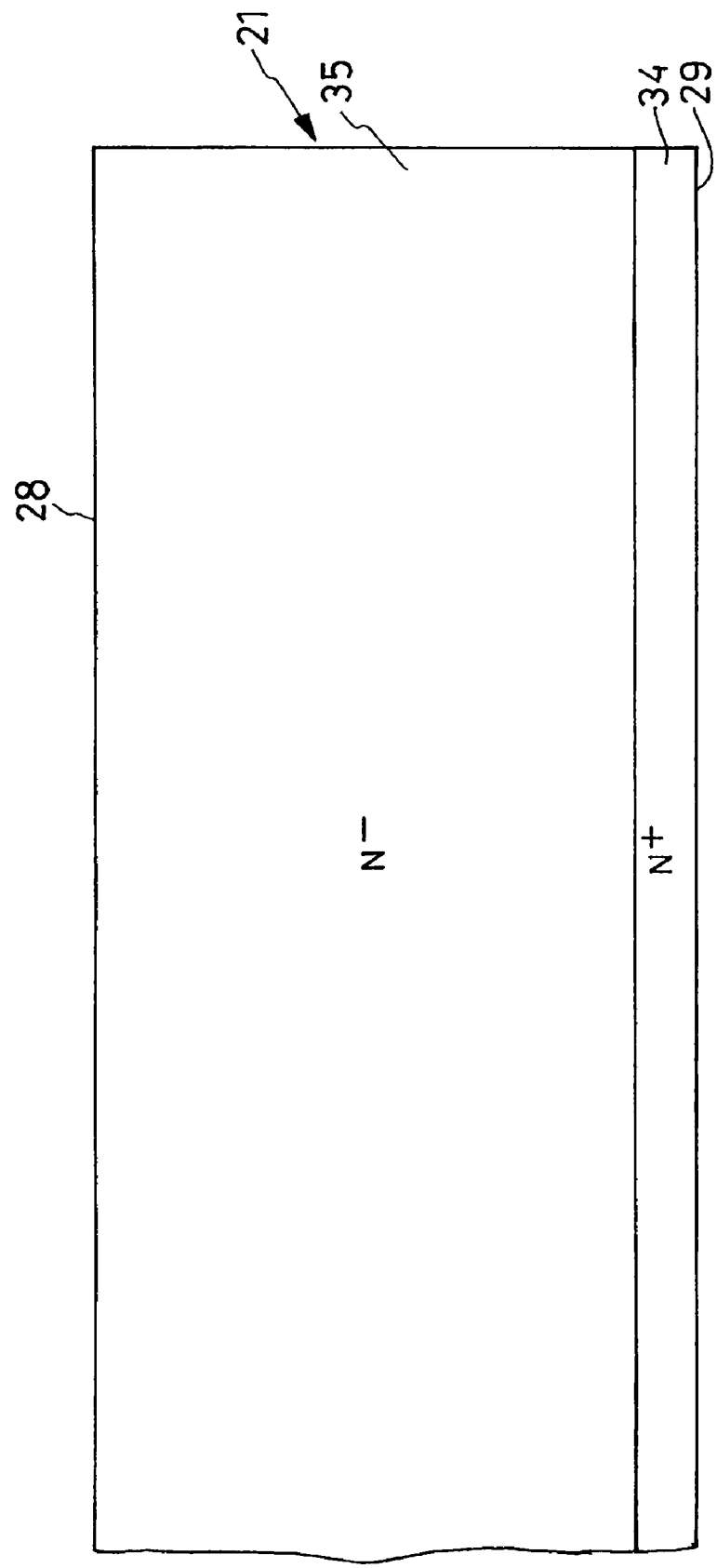
FIG. 6 is an explanatory sectional view showing the substrate of the IGFET of FIG. 3 in a state where it has just been started to be processed for the fabrication of the IGFET.

First, as illustrated in FIG. 6, there is prepared the silicon semiconductor substrate 21 having the $n^+$-type first drain region 34 and the $n^-$-type second drain region 35. The first drain region 34 is formed by diffusing n-type impurities into the substrate 21 from its second major surface 29. Alternatively, however, the first drain region 34 may be grown by epitaxy on the second drain region 35.

Then, as indicated in FIG. 7, the first major surface 28 of the substrate 21 is covered with a diffusion mask 47 having an opening 48. A p-type impurity (such as boron) is thermally diffused into the substrate 21 through the opening 48 in the diffusion mask 47 thereby forming the first body region 36 in an island-like shape contiguous to the $n^-$-type second drain region 35. The p-n junction 43 between the $n^-$-type second drain region 35 and the p-type first body region 36 extends parallel to the p-type first major surface 28 of the substrate 21 but is, at the end, curved toward that substrate surface. As has been stated in conjunction with FIG. 3, the second outer subregion 46 of the first body region 36, having been masked during the formation of this region by diffusion, is less in mean p-type impurity concentration than the other, unmasked parts of the first body region.

Figure 8:
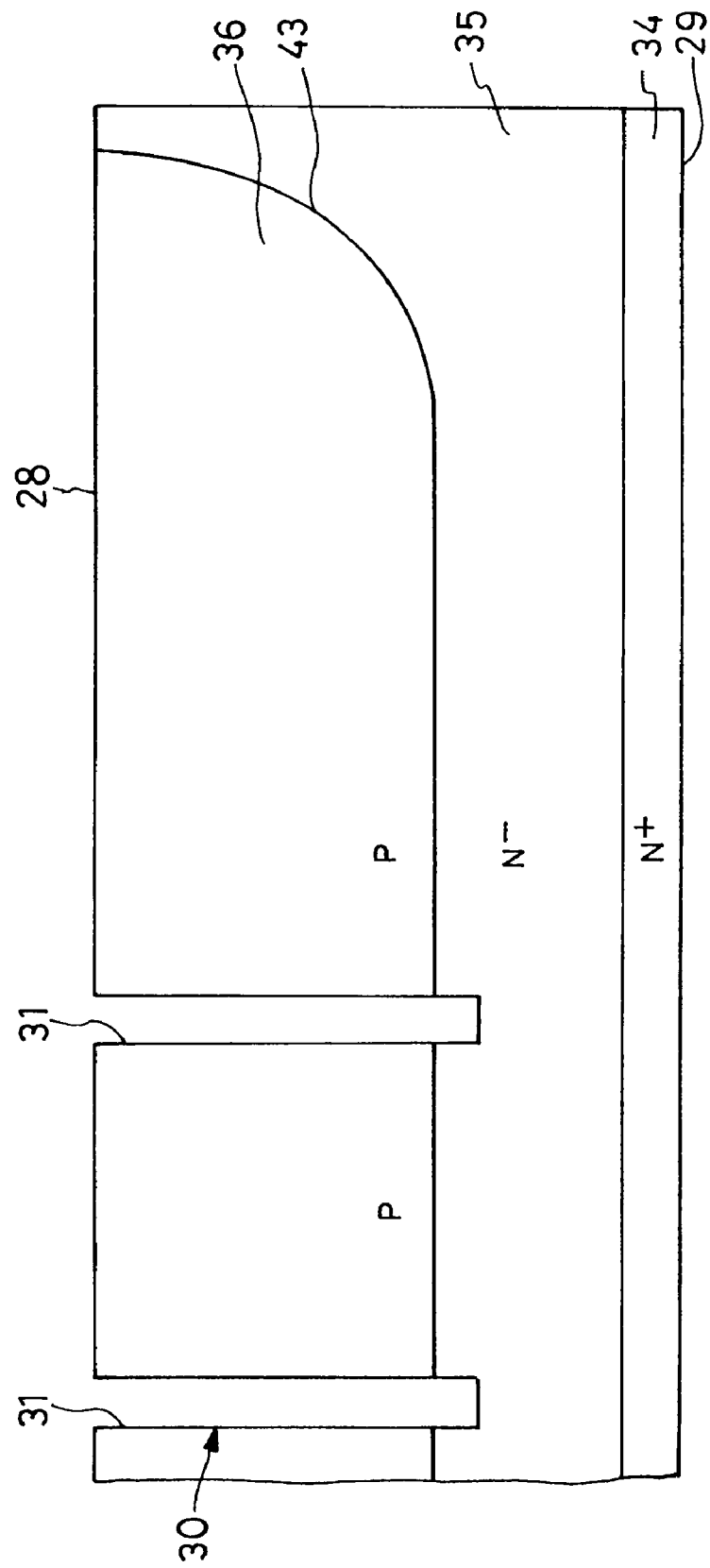
FIG. 8 is a view similar to FIG. 7 but showing the substrate after the subsequent formation of trenches therein.

Then, by carrying out known anisotropic etching on the first major surface 28 of the semiconductor substrate 21, the trenches 30 comprised of the cell trenches 31 shown in FIG. 8 and the first and second connective trenches 32 and 33 shown in FIG. 4 are formed. The formation of the trenches 30 at this time is not essential; instead, they may be formed either after the formation of the second body region 37, after the formation of the first source region 38, or after the formation of the second source region 39.

Figure 9:
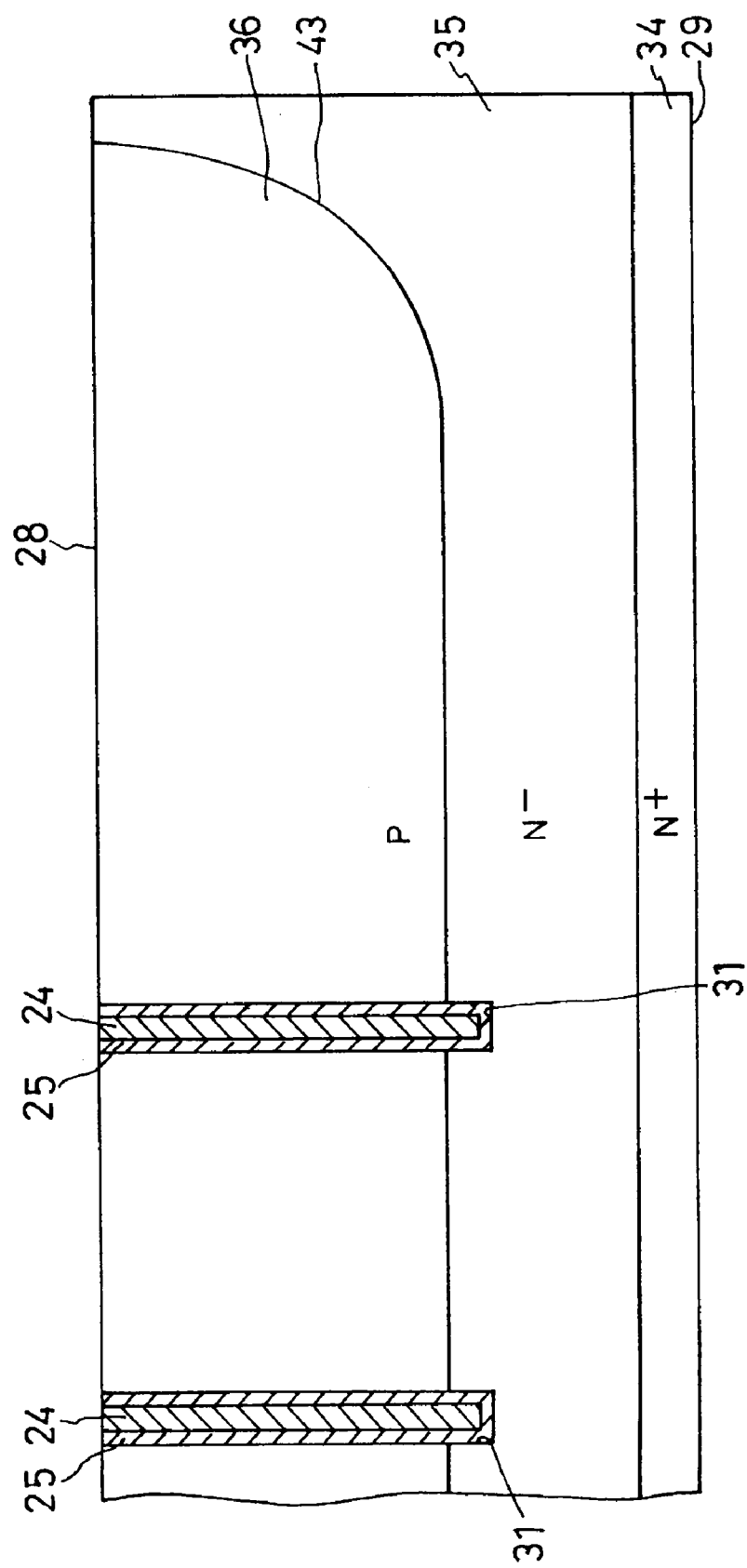
FIG. 9 is a view similar to FIG. 8 but showing the substrate after the subsequent formation of gate insulator films and gate electrodes in the trenches.

Then thermal oxidization is carried out on the semiconductor substrate 21 of silicon so that the gate insulator film 5 of silicon oxide is formed on the walls of the trenches 30, and further the gate electrodes 24 of conducting polycrystalline silicon are formed in the trenches 30 via the gate insulator films 25. The gate electrodes 24 may not necessarily be flush with the first major surface 28 of the substrate 21 as shown in FIG. 9; instead, the height of the gate electrodes 24 may be either greater or less than the depth of the trenches 30.

Then the $p^-$-type second body region 37 is, as shown in FIG. 3, formed in the p-type first body region 36 by, from the first major surface 28 of the substrate 21, selectively diffusing phosphorus or other n-type impurities in a moderate concentration not sufficient to change the conductivity type into a n-type. The diffusion of the n-type impurity into the first body region 36 alleviates the p-type conductivity of the latter, resulting in the formation of the $p^-$-type second body region 37 in part of the first body region 36.

Then phosphorus or like n-type impurities are selectively diffused into the second body region 37 to form the n-type first source region 38 and Schottky barrier diode protect semiconductor region 40 as in FIG. 3. The formation of the first source region 38 will make the $p^-$-type second body region 37 somewhat deeper.

Then arsenal or like n-type impurities are selectively diffused into the first source region 38 to form the $n^+$-type second source region 39 as in FIG. 3.

The IGFET 20 is completed upon subsequent formation of the insulating films 26 and 27, drain electrode 22 and source electrode 23.

Figure 10:
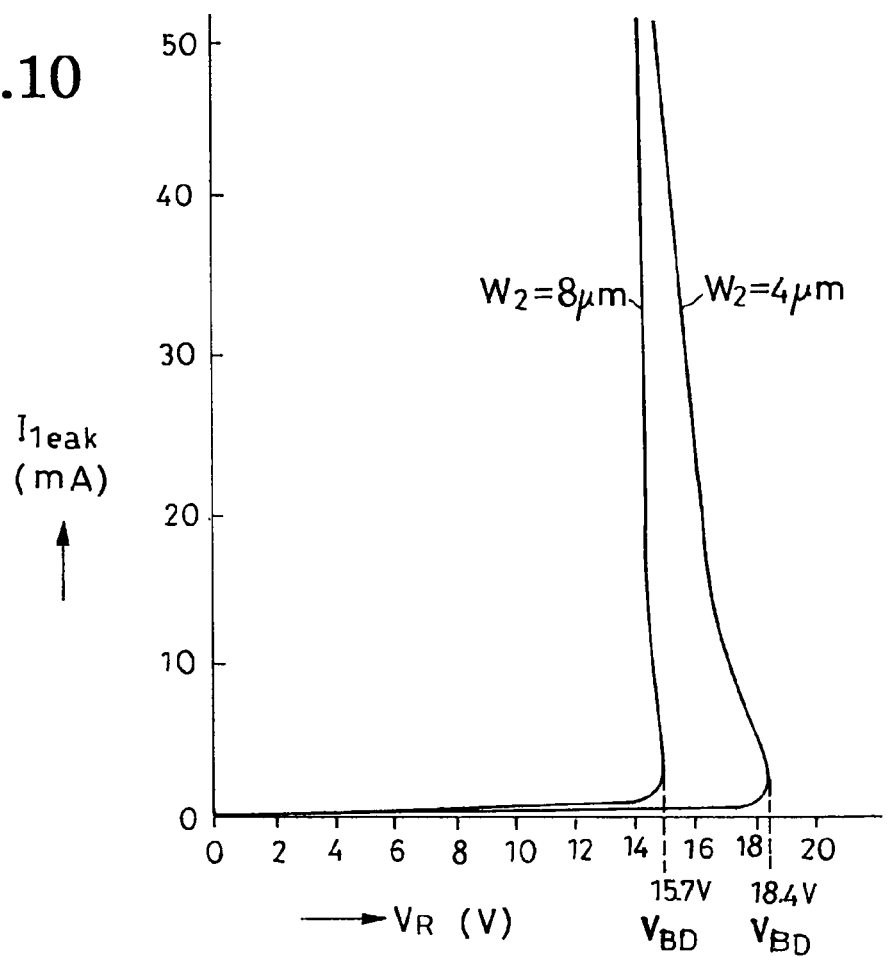
FIG. 10 is a graph plotting the curves of the leak current against the reverse voltage in the IGFET of FIG. 3 at some different widths of the Schottky contact area of the Schottky-barrier-diode-forming outer subregion of the second body region.

Improvement in blocking voltage of the IGFET 20 gains will now be described hereinafter. The Schottky barrier diode constituted of the source electrode 23 and the Schottky-barrier-diode-forming cell subregion 50 of the second body region 37, and the Schottky barrier diode constituted of the source electrode 23 and the Schottky-barrier-diode-forming outer subregion 51 of the second body region 37, are both inversely biased when the IGFET 20 is off and the source electrode 23 higher in potential than the drain electrode 22. Holes are ejected into the Schottky-barrier-diode-forming cell subregion 50 of the second body region 37 from its Schottky junction with the source electrode 23, and also into the Schottky-barrier-diode-forming outer subregion 51 of the second body region 37 from its Schottky junction with the source electrode 23. When both the first and second body regions 36 and 37 have relatively low hole populations, electron injection from the second drain region 35 into the first body region 36 to a level enough to cause conductivity modulation will not occur. The leak current $I_{leak}$ flowing between drain electrode 22 and source electrode 23 due to the holes changes as the reverse voltage $V_R$ impressed between these electrodes 22 and 23 changes, as shown in FIG. 10. The leak current $I_{leak}$ rises abruptly when the reverse voltage $V_R$ builds up to the breakdown voltage $V_{BD}$ of the IGFET. With a gradual rise in the reverse voltage $V_R$ from zero to the breakdown voltage $V_{BD}$, the hole current or leak current $I_{leak}$ will flow transversely across the Schottky-barrier-leak diode-forming outer subregion 51 of the second body region 37 and the outer subregion 45 of the first body region 36, as indicated by the arrow 62 in FIG. 3.

The leak current $I_{leak}$ needs some further elaboration. The difference in impurity concentration between the second outer subregion 46 of the p-type first body region 36 and the $n^-$-type second drain region 35 is less than that between the first outer subregion 45 of the first body region 36 and the second drain region 35. The p-n junction between the second drain region 35 and the second outer subregion 46 of the first body region 36 offers a less barrier than does the p-n junction between the second drain region 35 and the first outer subregion 45 of the first body region 36. As a result, the leak current $I_{leak}$ flows toward the p-n junction between the second drain region 35 and the second outer subregion 46 of the first body region 36. It is thus seen that before IGFET breakdown, the leak current flows along the path sequentially comprising the source electrode 23, the Schottky-barrier-diode-forming outer subregion 51 of the second body region 37, the first outer subregion 45 of the first body region 36, the second outer subregion 46 of the first body region 36, the second drain region 35, the first drain region 34, and the drain electrode 22. The leak current $I_{leak}$ becomes greater with the reverse voltage, resulting in a greater voltage drop transversely of the outer subregions 45 and 46 of the first body region 36. Finally, when the transverse voltage drop across the first body region 36 exceeds the threshold (approximately 0.6 volt) of the p-n junction 43, this junction turns on, permitting electron injection from second drain region 35 into first body region 36. A conductivity modulation thus takes place in both first and second body regions 36 and 37, and the central section 41 and peripheral section 42 of the substrate 21 wholly break down, resulting in an increase in leak current $I_{leak}$.

There will be some leak current that flows through the cell subregion 44 and first outer subregion 45 of the first body region 36. However, the barriers offered by the p-n junctions between the cell subregion 44 and first outer subregion 45 of the p-type first body region 36 and the $n^-$-type second drain region 35 are so much greater than that of the p-n junction between the second outer subregion 46 of the p-type first body region 36 and the $n^-$-type second drain region 35 that the cell subregion 44 and first outer subregion 45 of the first body region 36 do not break down earlier than the second outer subregion 46 of the first body region 36.

The suppression of the leak current $I_{leak}$, indicated by the arrow 62 in FIG. 3, leads to the enhancement of the breakdown voltage $V_{BD}$ or reverse blocking voltage. The leak current $I_{leak}$ is restricted, and the reverse blocking voltage of the IGFET 20 improved, by setting limits upon the Schottky junction width $W_2$ between the source electrode and the Schottky-barrier-diode-forming outer subregion 51 of the second body region 37.

To be more specific, the Schottky junction width $W_2$ under consideration should be in the range of about 0.1-20.0 micrometers in the case where the pair of cell trenches 31 are spaced about 3-8 micrometers from each other. Experiment has proved that the breakdown voltage $V_{BD}$ is 15.7 volts when the Schottky junction width $W_2$ is eight micrometers, and 18.4 volts when the Schottky junction width $W_2$ is four micrometers.

Figure 11:
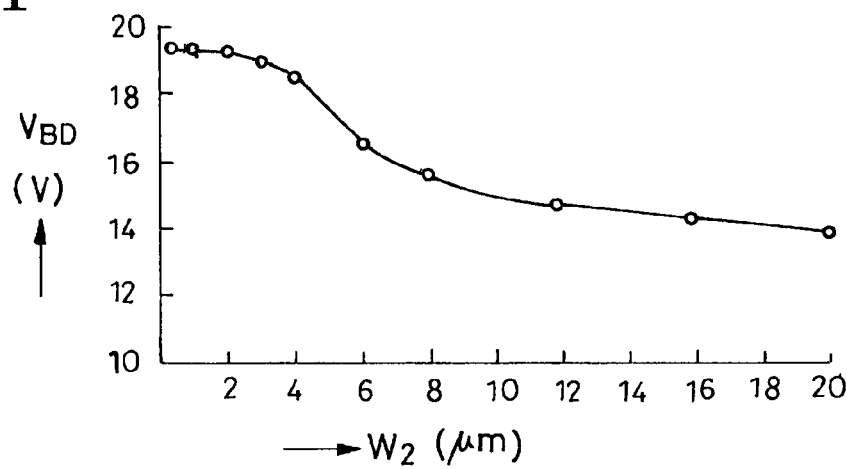
FIG. 11 is a graph plotting the curve of the breakdown voltage of the IGFET of FIG. 3 against the width of the Schottky contact area of the Schottky-barrier-diode-forming outer subregion of the second body region.

FIG. 11 shows a relation between change in the Schottky junction width $W_2$ and the voltage $V_{BD}$ in a case where the implantation amount of the n-type impurities (such as phosphorous) is made into $1.25 \times 10^{13}$ $cm^{-3}$ at a time of formation of the source electrode 23 and the second body region 37. As being apparent from the relation, as the Schottky junction width $W_2$ decreases below 20 micrometers, the improvement effect about the breakdown voltage $V_{BD}$ becomes greater. In particular when the Schottky junction width $W_2$ goes below 6 micrometers, the improvement effect about the breakdown voltage $V_{BD}$ becomes prominently great. In the meantime, if the Schottky junction width $W_2$ overly decreases, manufacturing variations would give rise to accidentally produce Schottky junctions having a zero width $W_2$. That the Schottky junction width $W_2$ is zero means, of course, that the Schottky-barrier-diode-forming outer subregion 51 of the second body region 37 has no surface in Schottky contact with the source electrode 23. There would appear instead an NPN transistor in the peripheral section 42 of the substrate 21. The NPN transistor appearing would be constituted of an n-type layer formed by the source regions and 39 and n-type Schottky barrier diode protect semiconductor layer 40, a p-type layer formed by the Schottky-barrier-diode-forming outer subregion 51 of the second body region 37 and the first body region 36, and an n-type layer formed by the first and the second drain regions 34 and 35. The IGFET would then be lower in reverse blocking voltage. The second Schottky junction width $W_2$ should therefore be not less than about 0.1 micrometer. As is apparent from FIG. 11, moreover, the second Schottky junction width $W_2$ should not much exceed 20 micrometers because then a resulting improvement in reverse blocking voltage would be negligible and out of proportion with an accompanying increase in substrate size.

In the meantime, while FIG. 11 shows a relation between the Schottky junction width $W_2$ and the voltage $V_{BD}$ in a case where a mutual interval of paired cell trenches 31 is 5 micrometers, it is also verified that a similar relation between the second Schottky junction width $W_2$ and the breakdown voltage $V_{BD}$ can be obtained even in a case where the mutual interval is changed into 4 micrometers. Further, similar relationship have also proved to result irrespective of variations in the phosphorus or other n-type impurity concentration of the second body region 37. While the breakdown voltage of the test IGFETs was measured at room temperature in the FIG. 11 experiment, similar improvements in breakdown voltage with reduction of the second Schottky junction width $W_2$ were obtained when the breakdown voltage was measured at as high temperatures as 100 degrees C. and 150 degrees C.

Moreover, it has been confirmed that the second Schottky contact width $W_2$ should be from 1/10 to 10 times the first Schottky contact width $W_1$ for better results, and not less than 1/10 and less than one times the first Schottky contact width $W_1$ for the best results. It has also been confirmed that the area of the Schottky contact between the source electrode 23 and the Schottky-barrier-diode-forming outer subregion 51 of the second body region is from 1/10 to 10 times the area of the Schottky contact between the source electrode 23 and the Schottky-barrier-diode-forming cell subregion 50 of the second body region 37 for better results, and not less than 1/10 and less than one times the first Schottky contact width $W_1$ for the best results.

The IGFET according to the present embodiment share the following benefits (1), (2), (3), (4) and (5) as with that of the above cited PCT application and uniquely gains the succeeding benefits (6), (7) and (8).

(1) Thanks to the Schottky barrier diode $D_3$ which is opposite in polarity to the first p-n junction diode $D_1$, the current flowing through other than the channels 49 in the substrate 21 when the source electrode 23 is higher in potential than the drain electrode 22 is blocked by the Schottky barrier diode $D_3$. A unidirectional IGFET is thus obtained.

(2) The current control of the channels 49 by gate-source voltage is possible both when the source electrode 23 is higher and lower in potential than the drain electrode 22.

(3) The second drain region 35 is not exposed at the first major surface of the substrate 21 in its central section 41, so that the channels 49 are spaced a relatively short distance from the n$^+$-type first drain region 34. The current paths through the second drain region 35 are therefore shorter than those through the second drain region 7, FIG. 1, in the prior art IGFET. The on-resistance of the IGFET 20 can thus been made as low as a quarter of that of the prior art IGFET of FIG. 1.

Figure 1:
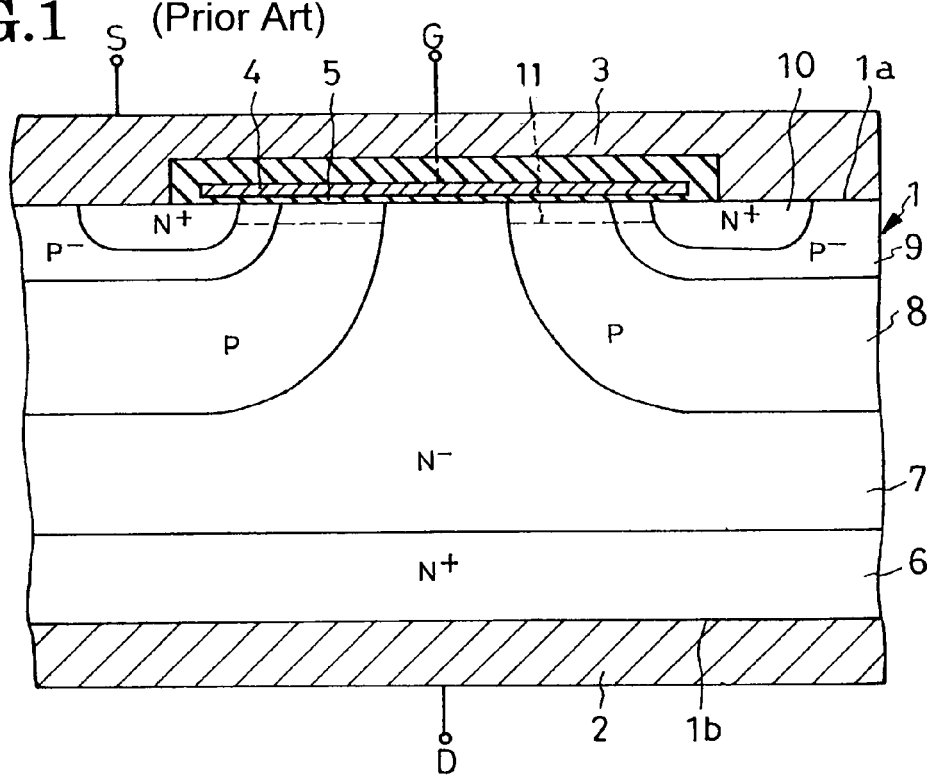
FIG. 1 is an explanatory sectional view of the prior art IGFET.
Figure 2:
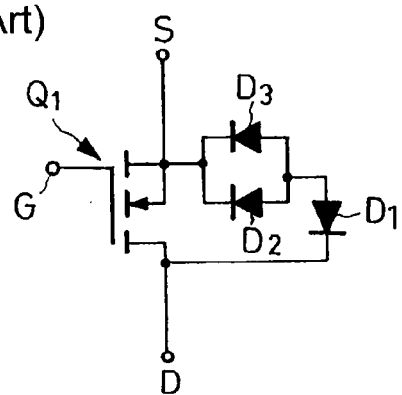
FIG. 2 is an equivalent circuit diagram of the prior art IGFET of FIG. 1.

(4) In the cell part of the substrate 21, the first source region 38 is provided which is less in n-type impurity concentration than the second source region 39, and the p-n junction 43 has a smaller area than in the prior art device of FIG. 1. There is therefore little or no likelihood of conduction taking place through the parasitic npn transistor constituted of the n$^-$-type second drain region 35, p-type first body region 36, p$^-$-type second body region 37, and n-type first source region 38. This parasitic transistor on conduction could ruin the IGFET. Even if not of such magnitude as to cause the breakdown of the IGFET, the current flowing through the parasitic transistor is a leak current, lowering the blocking voltage rating of the IGFET.

(5) The IGFET is made more compact than the prior art planar IGFET of FIG. 1 as each IGFET cell is formed between one pair of cell trenches 31.

(6) The peripheral section 42 of the substrate 21 contains parts of the drain regions 34 and 35, body regions 36 and 37, and source regions 38 and 39, as well as the Schottky barrier diode protect semiconductor region 40, and the second drain region 35 is peripherally exposed at the first major surface 28 of the substrate, so that the p-n junction between second drain region 35 and first body region 36 is both conveniently and positively protected by the insulating film 26 on the first major surface of the substrate.

(7) With the Schottky barrier junction width $W_2$ limited to the range of 0.1-20.0 micrometers, preferably 0.1-0.6 micrometers, the leak current Ileak indicated by the arrow 62 in FIG. 3 is reduced to a minimum, resulting in a higher breakdown voltage, and hence higher blocking voltage, of the IGFET 20.

(8) Both Schottky barrier diode protect semiconductor region 40 and outer subregion 53 of the first source region 38 serve to guard the Schottky-barrier-diode-forming outer subregion 51 of the second body region 37, protecting the Schottky barrier diode formed by the source electrode 23 and the Schottky-barrier-diode-forming outer subregion 51 from reverse voltages.

Second Embodiment

An IGFET according to the second embodiment will now be described with reference to FIGS. 12 and 13. In this FIGS. 12 and 13, as well as in FIGS. 14-19, parts substantially similar to the parts shown in FIGS. 3 and 4 will be identified by like reference characters, and their description will be omitted.

Figure 12:
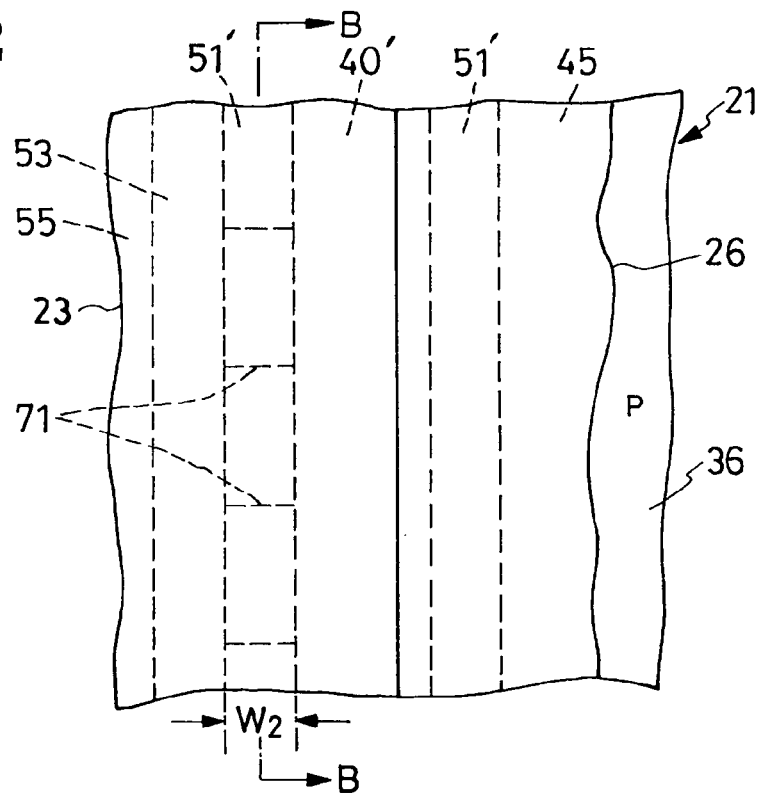
FIG. 12 is a fragmentary plan view of explanatory nature showing an IGFET according to a second embodiment of the present invention.
Figure 13:
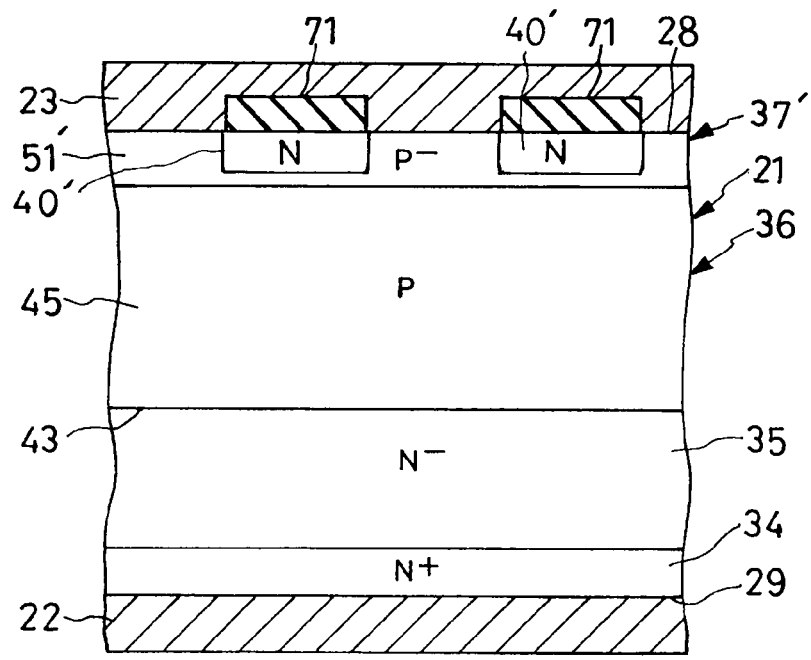
FIG. 13 is a fragmentary section of explanatory nature showing the IGFET of FIG. 12 as taken along the line B-B in FIG. 12.

FIG. 12 is a fragmentary plan view of the second preferred form of IGFET according to the present embodiment, and FIG. 13 is a section taken along the line B-B in FIG. 12, that line being parallel to the cell trenches 31, FIG. 3, which do not appear in FIGS. 12 and 13. This embodiment features a second body region 37' having a modified Schottky-barrier-diode-forming outer subregion 51', a modified n-type Schottky barrier diode protect semiconductor region 40', and insulating film 71, all the other details of construction being as described above with reference to FIGS. 3 and 4. The protect semiconductor region 40' has arms extending across the Schottky-barrier-diode-forming outer subregion 51' of the second body region 37', so that the Schottky contact (width $W_2$) of this subregion 51' with the source electrode 23 is interrupted by the arms of the protect semiconductor region 40' which are spaced from one another longitudinally of the Schottky-barrier-diode-forming outer subregion 51'. The insulating film 71 overlies these arms of the protect semiconductor region 40', electrically insulating them from the source electrode 23. Consequently, the Schottky-barrier-diode-forming outer subregion 51' of the second body region 37' makes Schottky junction with the source electrode 23 only at the spacings between the arms of the protect semiconductor region 40'.

Provided that the Schottky-barrier-diode-forming outer subregion 51' of the second body region 37' has the same width $W_2$ as that of FIG. 3, this subregion 51' has nevertheless a significantly less area of Schottky contact with the source electrode 23. The less area of the Schottky junction between electrode 23 and subregion 51' results in the emission of less holes from this Schottky junction into the p-type Schottky-barrier-diode-forming outer subregion 51' and p-type first outer subregion 45 of the first body region 36 upon application of a reverse voltage to the Schottky junction between electrode 23 and subregion 51'. Thus, for application of a given reverse voltage, an IGFET with a less area of the Schottky junction in question has a less leak current than does an IGFET with a greater area of the Schottky junction. As has been stated, the less leak current, the higher is the breakdown voltage or blocking voltage rating of the IGFET.

It is now clear that the interruption of the Schottky junction between source electrode 23 and Schottky-barrier-diode-forming outer subregion 51' at longitudinal intervals, taught by this embodiment of FIGS. 12 and 13, is tantamount to the narrowing of the Schottky junction width $W_2$ in the FIG. 1 embodiment. The objective of higher blocking voltage is attainable either way. The other advantages listed in connection with the first embodiment hold true with this second one.

The area of contact between source electrode 23 and Schottky-barrier-diode-forming outer subregion 51' of the second embodiment should be from 1/10 to 20, preferably not less than 1/10 and less than 1, times the contact area between the source electrode 23 and the Schottky-barrier-diode-forming cell portion 50, FIG. 3, of the second body region 37 in the first embodiment. Should the Schottky contact area of the subregion 51' fall short of a tenth of that of the cell portion 50, the desired Schottky barrier diode might become unobtainable. If it were greater than times, on the other hand, the desired improvement in breakdown voltage might not result.

Third Embodiment

Figure 14:
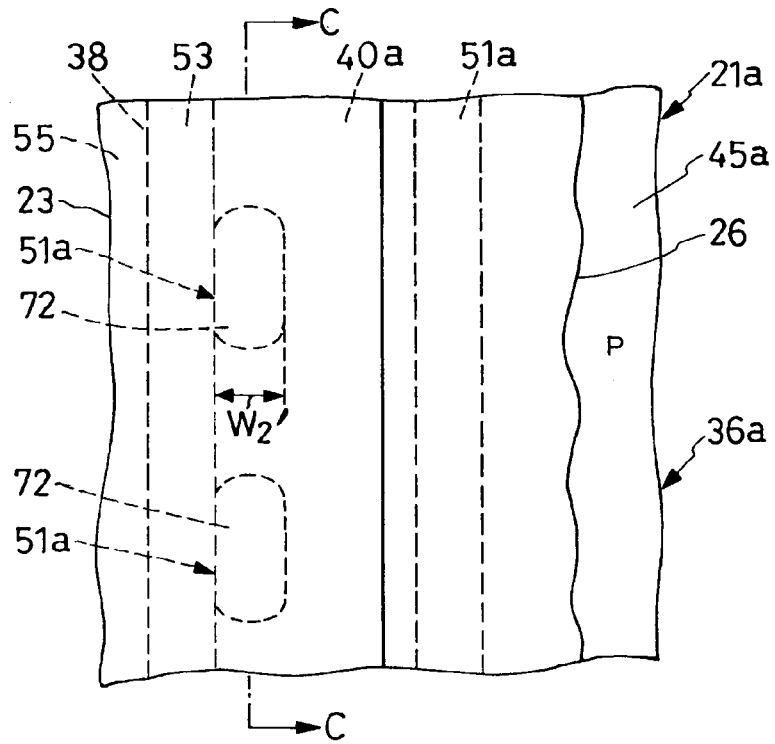
FIG. 14 is a fragmentary plan view of explanatory nature showing an IGFET according to a third embodiment of the present invention.
Figure 15:
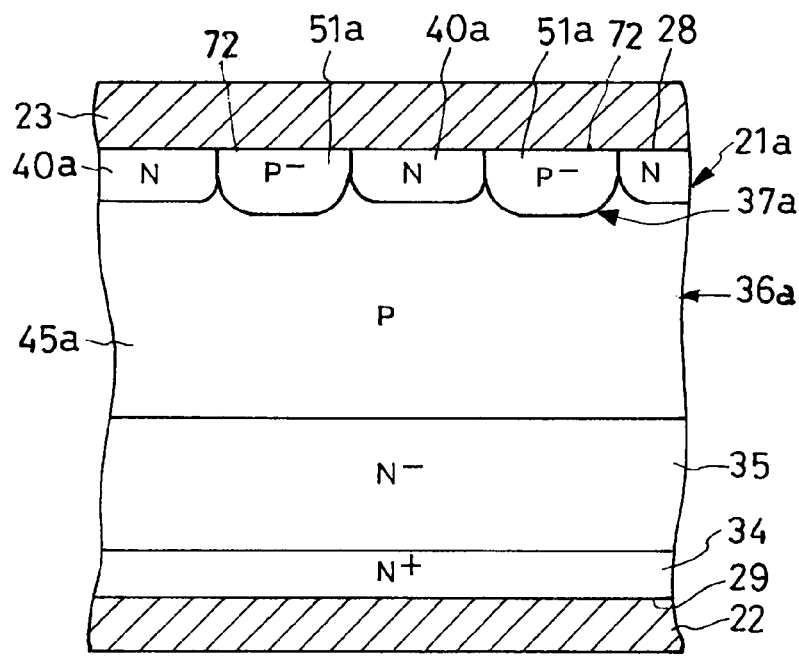
FIG. 15 is a fragmentary section of explanatory nature showing the IGFET of FIG. 14 as taken along the line C-C in FIG. 14.

FIGS. 14 and 15 are views similar respectively to FIGS. 12 and 13 but showing a third preferred form of IGFET according to the present embodiment. Instead of lessening the Schottky contact area of the outer subregion 51 of the second body region 37 by the insulating film 71 on the arms of the Schottky barrier diode protect semiconductor region 40' as in FIGS. 12 and 13, the same objective is attained in this third embodiment by providing a second body region 37a of modified shape. This embodiment is akin to the two foregoing ones in all the other details of construction.

The semiconductor substrate 21a shown in FIGS. 14 and 15 is of the same construction as the semiconductor substrate 21 shown in FIGS. 3 and 13 but differs only in a point that the substrate 21a has first and second body regions 36a and 37a and a Schottky barrier diode protect semiconductor region 40a in a modified form. More specifically, the FET cell of these drawings from which showing of the IGFET is omitted is structured in a way as that of FIG. 3. The modified first body region 36a differs from its FIG. 3 counterpart 36 only in its first outer subregion 45a, which, unlike its FIG. 3 counterpart 45, is in direct contact with the Schottky barrier diode protect semiconductor region 40a. The second body region 37a is of the same construction as its FIG. 3 counterpart 37 except for its Schottky-barrier-diode-forming outer subregion 51a. The Schottky-barrier-diode-forming outer subregion 51a of the second body region 37a takes the form of a series of spaced-apart segments 72, each with a width $W_2'$, which are in Schottky contact with the overlying source electrode 23. All the segments 72 of the Schottky-barrier-diode-forming outer subregion 51a are aligned parallel to the cell trenches 31, FIG. 3, and alternate with parts of the Schottky barrier diode protect semiconductor region 40a. Each segment 72 is therefore surrounded by the outer subregion 53 of the first source region 38 and the Schottky barrier diode protect semiconductor region 40a, besides being in contact with the underlying first outer subregion 45a of the first body region 36a.

In this third embodiment shown in FIGS. 14 and 15, the area of Schottky contact between source electrode 23 and second body region 37a is reduced by dividing the Schottky-barrier-diode-forming outer subregion 51a of the second body region 37a into the series of discrete segments 72. Assuming that the width $W_2$ of each segment 72 is equal to the width $W_2$ of Schottky contact between the source electrode 23 and the Schottky-barrier-diode-forming outer subregion 51 in the FIG. 3 embodiment, the Schottky junction area is less in this third embodiment by an amount depending upon the sum of the spacings between the segments 72. This embodiment enjoys the same effects as does the preceding second embodiment of FIGS. 12 and 13.

Fourth Embodiment

Figure 16:
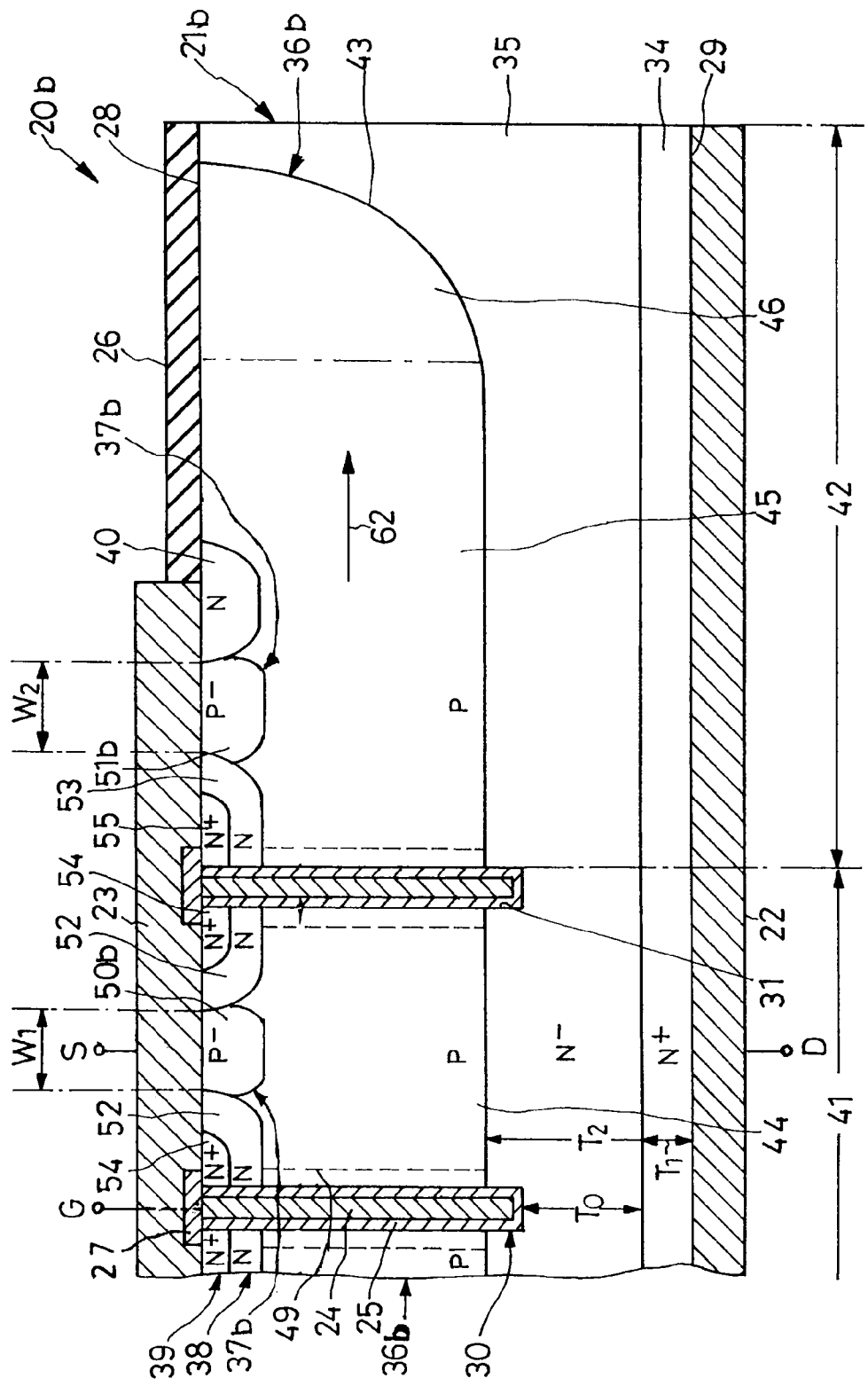
FIG. 16 is a view similar to FIG. 3 but showing an IGFET according to a fourth embodiment of the present invention.

The IGFET 20b shown in FIG. 16 features a modified second body region 37b, all the other details of construction being as described above in connection with the IGFET 20 of FIG. 3. The second body region 37b differs from its FIG. 3 counterpart 37 in having no parts contiguous to the cell trenches 31. Only those parts of the Schottky-barrier-diode-forming cell subregion 50 and Schottky-barrier-diode-forming outer subregion 51 of the second body region 37 of FIG. 3 which are in immediate vicinities of the source electrode 23 are left in FIG. 16 and redesignated 50b and 51b respectively. The second body region 37 or 37b is designed to form Schottky barrier diodes in combination with the source electrode 23. The necessary functional parts of the second body region 37 are fully retained in the modified second body region 37b, so that the IGFET 20b offers the same advantages as does the FIG. 3 IGFET 20.

Fifth Embodiment

Figure 17:
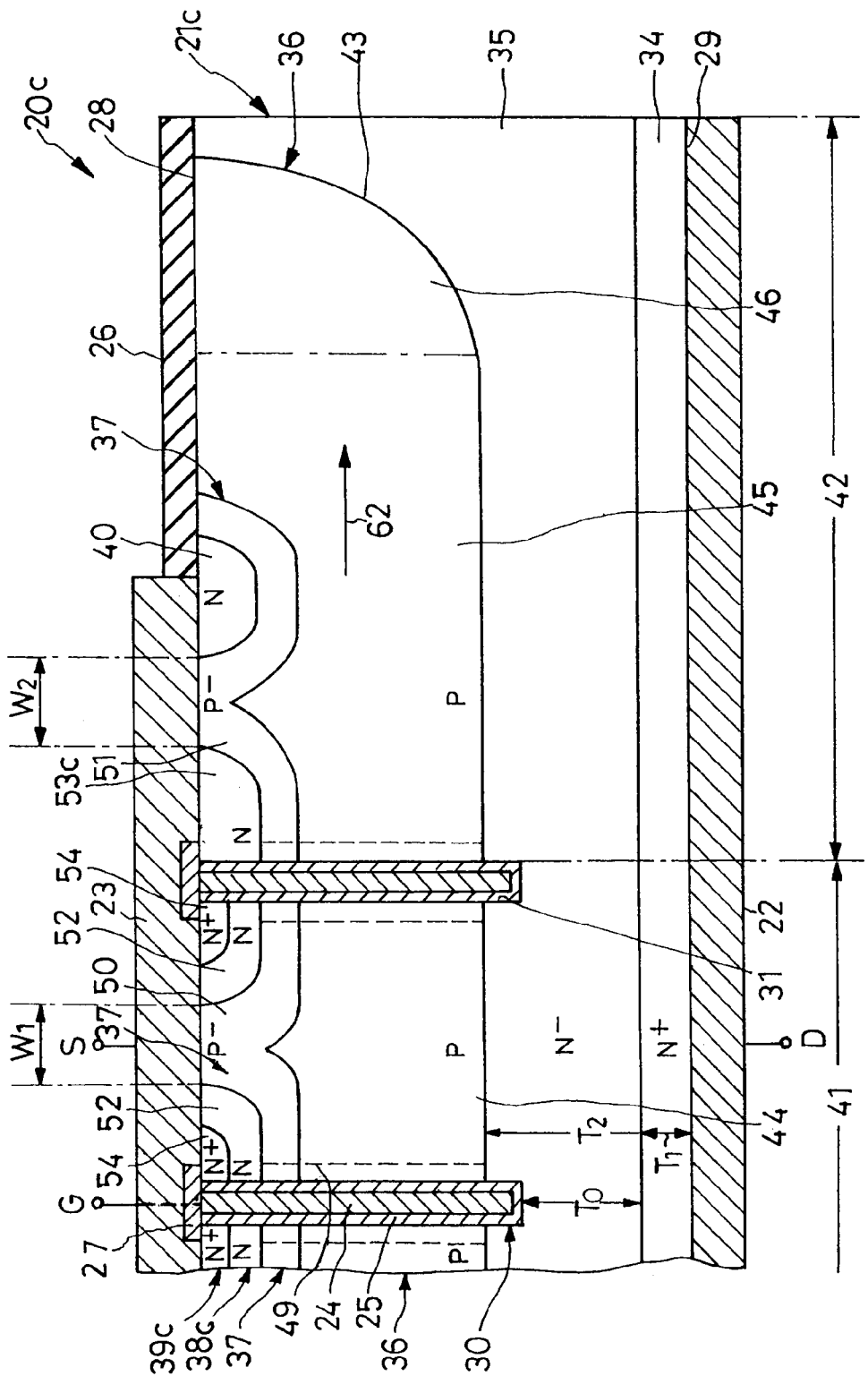
FIG. 17 is also a view similar to FIG. 3 but showing an IGFET according to a fifth embodiment of the present invention.

An IGFET 20c of the fifth embodiment illustrated in FIG. 17 has a modified semiconductor substrate 21c. The modified substrate 21c differs from its FIG. 3 counterpart 21 only in its first and second source regions 38c and 39c. The second source region 39c differs from its FIG. 3 counterpart 39 in having no outer subregion 55. The outer subregion 53c of the first source region 38c has a greater surface exposed at the first major surface 28 of the substrate 21c than does the outer subregion 53 of the first source region 38 in FIG. 3. The Schottky-barrier-diode-forming outer subregion 51 of the second body region 37 has its surface of junction with the source electrode 23 confined between the Schottky barrier diode protect semiconductor region 40 and the outer subregion 53c of the first source region 38c, the latter being approximately the same in n-type impurity concentration as the former. Thus is the Schottky barrier diode, constituted of the source electrode 23 and the outer subregion 51 of the second body region 37, positively protected. Despite such modifications in the substrate 21c, the IGFET 20c of FIG. 17 possesses the same benefits as the IGFET 20 of FIG. 3. The omission of the outer subregion of the second source region taught by this embodiment is also possible in that of FIG. 16.

The present invention is not to be limited by the exact details of the embodiments disclosed herein but can be modified in various ways such as the following.

(1) Only one drain region could be substituted for the two drain regions 34 and 35 of all the foregoing embodiments; for example, the n$^+$-type first drain region 34 might be omitted, and the drain electrode 22 placed in direct contact with the remaining drain region 35.

(2) The n-type first source region 38 is also omissible, particularly when the pair of cell trenches 31 are spaced five micrometers or less from each other. The IGFET will suffer little or no drop in breakdown voltage from the absence of the first source region 38.

(3) The formation of the two source regions 38 and 39 of two distinctly different n-type impurity concentrations by two impurity diffusing operations is not essential; instead, one such operation may be effected to provide a single source region in which the impurity concentration infinitely diminishes from the first substrate surface 28 toward the second body region 37.

Figure 18:
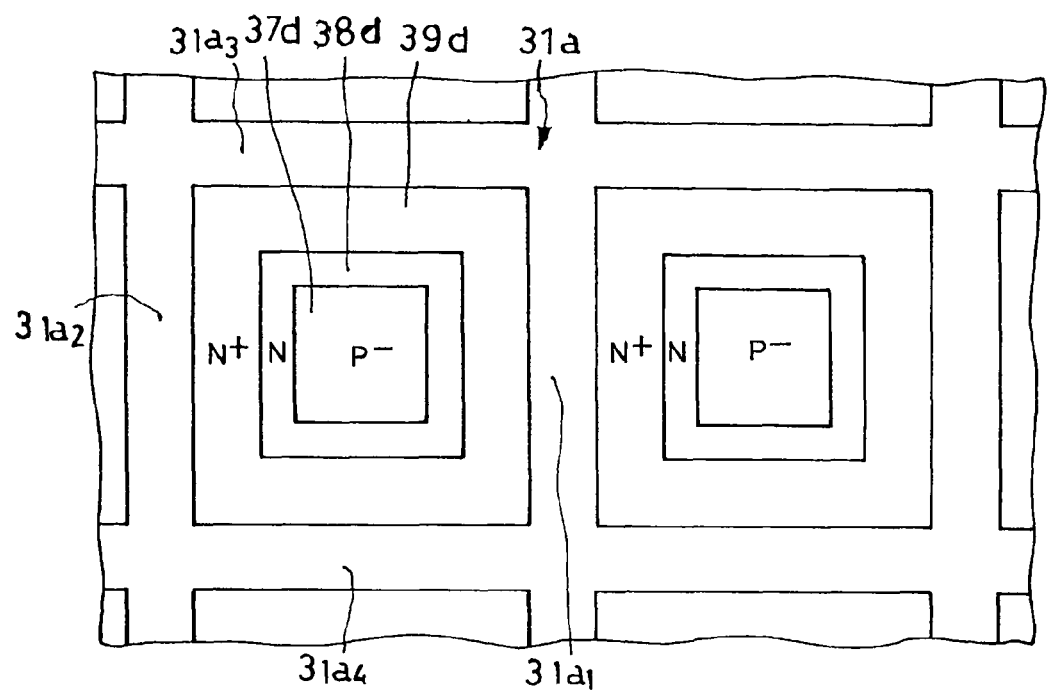
FIG. 18 is a fragmentary plan view of explanatory nature showing an IGFET substrate having a different pattern of cell-forming trenches.

(4) The parallel cell trenches 31 of FIG. 4 are replaceable by trenches 31a, FIG. 18, of gridlike arrangement. A p$^-$-type second region 37d, n-type first source region 38d and n+-type second source region 39d may be disposed concentrically in each of the rectangular substrate parts bounded by the gridlike trenches 31a. In this case, out of each rectangle formed by the gridlike trenches 31a, the pair of opposite sides $31a_1$ and $31a_2$ or the other pair of opposite sides $31a_3$ and $31a_4$ may be considered one pair of cell trenches forming each IGFET cell. Although not shown in FIG. 18, an annular outer trench is understood to be formed around the gridlike cell trenches 31a. The equivalents of the two outer subregions 45 and 46, FIG. 3, of the first body region 36, Schottky-barrier-diode-forming outer subregion 51 of the second body region 37, outer subregion 53 of the first source region 38, outer subregion 55 of the second source region 39, and Schottky barrier diode protect semiconductor region 40 may be provided outside the unshown annular outer trench.

Figure 19:
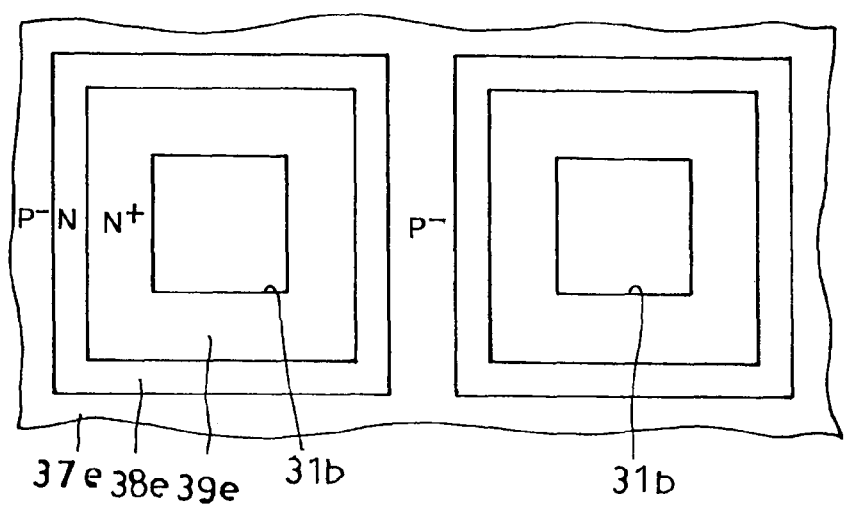
FIG. 19 is a view similar to FIG. 18 but showing an IGFET substrate having another modified pattern of cell-forming trenches.

(5) The parallel cell trenches 31 of FIG. 4 are further replaceable by wells such as indicated at 31b in FIG. 19. A p$^-$-type second region 37e, n-type first source region 38e and n$^+$-type second source region 39e may be disposed concentrically around each well 31b. In this case, too, an annular outer trench is to be formed around the wells 31b. The equivalents of the two outer subregions 45 and 46, FIG. 3, of the first body region 36, Schottky-barrier-diode-forming outer subregion 51 of the second body region 37, outer subregion 53 of the first source region 38, outer subregion 55 of the second source region 39, and Schottky barrier diode protect semiconductor region 40 may be provided outside the unshown annular outer trench.

(6) With reference to FIG. 3 those parts of the body regions 36 and 37 which adjoin the cell trenches 31 may be made higher in p-type impurity concentration than at their other parts by impurity injection from within the cell trenches 31. The threshold voltage of the IGFET 20 will then become higher.

(7) Referring also to FIG. 3, the body regions 36 and 37 of the substrate may be irradiated with an electron beam of, say, two megaelectron volts via the source electrode 23 and then heated to a temperature of, say, 300 degrees C., in a hydrogen atmosphere. The electron beam irradiation serves to shorten the lifetime of the minority carriers in the body regions 36 and 37. As a result, upon application of a reverse voltage to the IGFET 20, the electrons (minority carriers) that have been injected into the body regions 36 and 37 from the second drain region 35 will quickly combine with the holes and be thereby prevented from flowing into the first source region 38. The current leakage of the IGFET will thus be further reduced, and its breakdown voltage further enhanced.

(8) All the n-channel IGFETs disclosed herein are modifiable into p-channel ones by reversing the indicated conductivity types of the semiconductor regions and subregions of the substrate, that is, from n- to p-type and from p- to n-type. The relative impurity concentrations of the constituent semiconductor regions of the p-channel IGFETs may be determined in conformity with the indicated relative impurity concentrations of the semiconductor regions of the n-channel IGFETs. Also, in the p-channel IGFETs, the source electrode 23 may be made from such metals as palladium, molybdenum or vanadium that are capable of Schottky contact with the n-type semiconductor region (second body region). In the p-channel IGFETs, conduction will take place between source and drain when the gate is made lower in potential than the source. The source potential must be set higher than the drain potential for normal operation of the p-channel IGFETs.

Although the invention has been described above by reference to certain embodiments of the invention, the invention is not limited to the embodiments described above. Modifications and variations of the embodiments described above will occur to those skilled in the art, in light of the above teachings.

What is claimed is:
1. A field-effect semiconductor device comprising:
a semiconductor substrate comprising first and second major surfaces extending parallel to each other, and at least a pair of trenches extending from the first major surface thereof toward but short of reaching the second major surface thereof;
a drain region of a first conductivity type having a surface exposed at the second major surface, the drain region being disposed contiguous to the pair of trenches;
a first body region of a second conductivity type comprising a cell subregion disposed between the pair of trenches and contiguous to the drain region, a first outer subregion disposed outside the pair of trenches and contiguous to the drain region and having a first mean impurity concentration, and a second outer subregion disposed outside the first outer subregion and contiguous to the drain region;
a second body region of the second conductivity type comprising a Schottky-barrier-diode-forming cell subregion and a Schottky-barrier-diode-forming outer subregion, the Schottky-barrier-diode-forming cell subregion having a mean impurity concentration lower than the first mean impurity concentration, being disposed between the pair of trenches and contiguous to the first body region, and having a surface exposed at the first major surface, the Schottky-barrier-diode-forming outer subregion having a mean impurity concentration lower than the first mean impurity concentration, being disposed outside the pair of trenches and contiguous to the first body region, and having a surface exposed at the first major surface;

a source region of the first conductivity type having a cell subregion and an outer subregion, the cell subregion being disposed between the pair of trenches and contiguous to both the Schottky-barrier-diode-forming cell subregion and the trenches and having a surface exposed at the first major surface, the outer subregion being disposed outside the pair of trenches and contiguous to both the pair of trenches and the Schottky-barrier-diode-forming outer subregion and having a surface exposed at the first major surface;

a Schottky barrier diode protect semiconductor region disposed outside the Schottky-barrier-diode-forming outer subregion and contiguous to the Schottky-barrier-diode-forming outer subregion and having a surface exposed at the first major surface;

a drain electrode disposed on the second major surface in ohmic contact with the drain region;

a source electrode disposed on the first major surface in ohmic contact with both the source region and the Schottky barrier diode protect semiconductor region and in Schottky contact with both the Schottky-barrier-diode-forming cell subregion and Schottky-barrier-diode-forming outer subregion;

a gate insulator formed in the pair of trenches; and a gate electrode disposed in the pair of trenches with interposing the gate insulator.

2. The field-effect semiconductor device as recited in claim 1, wherein the drain region of the semiconductor substrate is divided into:

a first drain region of the first conductivity type having a surface exposed at the second major surface; and a second drain region of the first conductivity type with an impurity concentration lower than that of the first drain region, the second drain region being disposed contiguous to both of the first drain region and the pair of trenches and has a surface exposed at the first major surface on the outside of the pair of trenches, the drain electrode being in ohmic contact with the first drain region.

3. The field-effect semiconductor device as recited in claim 1, wherein the first outer subregion is so formed that the p-n junction between the first outer subregion and the drain region extends parallel to the first major surface, and wherein the second outer subregion is so formed that the distance between the p-n junction between the second outer subregion and the drain region and the first major surface is gradually shorter toward a direction away from the first outer subregion.

4. The field-effect semiconductor device as recited in claim 1, wherein the second body region is disposed between the first body region and the source region and contiguous to the pair of trenches, and disposed at an entire place between the first body region and the Schottky barrier diode protect semiconductor region.

5. The field-effect semiconductor device as recited in claim 1, wherein the second body region is so formed as not to be contiguous to the trenches, wherein the source region is disposed contiguous to both the first and the second body regions, and wherein the Schottky barrier diode protect semiconductor region is disposed contiguous to both the first and the second body region.

6. The field-effect semiconductor device as recited in claim 1, wherein the cell subregion of the source region is divided into one part contiguous to one of the pair of trenches and another part contiguous to another of the pair of trenches in the semiconductor substrate, and wherein the cell subregion of the second body region is exposed at the first major surface between the two parts of the cell subregion of the source region.

7. The field-effect semiconductor device as recited in claim 1, wherein the cell subregion of the source region comprises a first source region disposed contiguous to both the second body region and the pair of trenches and having a surface exposed at the first major surface, and a second source region disposed contiguous to the first source region and having an impurity concentration higher than that of the first source region and having a surface exposed at the first major surface.

8. The field-effect semiconductor device as recited in claim 1, wherein the source electrode makes limited Schottky contact with a plurality of parts of the outer subregion of the second body region.

9. The field-effect semiconductor device as recited in claim 1, wherein the outer subregion of the second body region is divided into a plurality of parts.

10. The field-effect semiconductor device as recited in claim 1, wherein a width ($W_2$) of the Schottky contact between the source electrode and the outer subregion of the second body region is from about 1/10 to about 10 times a width ($W_1$) of the Schottky contact between the source electrode and the cell subregion of the second body region.

11. The field-effect semiconductor device as recited in claim 1, wherein a width ($W_2$) of the Schottky contact between the source electrode and the outer subregion of the second body region is from about 0.1 to about 20 micrometers.

12. The field-effect semiconductor device as recited in claim 1, wherein an area of the Schottky contact between the source electrode and the outer subregion of the second body region is from about 1/10 to about 10 times an area of the Schottky contact between the source electrode and the cell subregion of the second body region.

13. A method of producing a field-effect semiconductor device, comprising:

providing a semiconductor substrate of a first conductivity type, the semiconductor substrate having first and second opposite major surfaces;

forming a mask covering an outer part of the first major surface;

carrying out selective diffusion of an impurity of a second conductivity type into the semiconductor substrate by using the mask, thereby forming a first body region and obtaining a drain region comprising a part in the semiconductor substrate not subject to the diffusion of the impurity of the second conductivity type;

forming in the semiconductor substrate at least a pair of trenches extending from the first major surface toward the second major surface and having a depth to reach the drain region;

forming a gate insulator film on sides surfaces of the trenches;

forming in each trench a gate electrode which is opposed to at least the first body region with interposing the gate insulator film;

either before or after the formation of the trenches, selectively diffusing an impurity of the second conductivity type into the semiconductor substrate from the first major surface in a concentration not sufficient to change conductivity type, thereby forming a second body region of the second conductivity type comprising a Schottky-barrier-diode-forming cell subregion and a Schottky-barrier-diode-forming outer subregion, the Schottky-barrier-diode-forming cell subregion having a mean impurity concentration lower than that of the first body region, being disposed between the pair of trenches and contiguous to the first body region and having a surface exposed at the first major surface midway between the pair of trenches, the Schottky-barrier-diode-forming outer subregion having a mean impurity concentration lower than the first body region, being disposed contiguous to the first body region outside the pair of trenches and having a surface exposed at the first major surface outside the pair of trenches;

either before or after the formation of the trenches, selectively diffusing an impurity of the first conductivity type into the semiconductor substrate from the first major surface, thereby forming a source region comprising a cell subregion and an outer subregion, the cell subregion being disposed between the pair of trenches and contiguous to both the cell subregion of the second body region and the pair of trenches and having a surface exposed at the first major surface, the outer subregion being disposed outside the pair of trenches at the first major surface and contiguous to both the pair of trenches and the outer subregion of the second body region and having a surface exposed at the first major surface;

either concurrently with or separately from the formation of the source region, selectively diffusing an impurity of the first conductivity type into the semiconductor substrate from the first major surface, thereby forming a Schottky barrier diode protect semiconductor region so disposed as to have contiguity to the outer subregion of the second body region in a position farther away from the trenches than the outer subregion of the source region, the Schottky barrier diode protect semiconductor region having a surface exposed at the first major surface;

forming a drain electrode on the second major surface in ohmic contact with the drain region; and forming a source electrode on the first major surface in ohmic contact with both the source region and the Schottky barrier diode protect semiconductor region and in Schottky contact with the second body region.

* * * * *